United States Patent
Hanamura et al.

(10) Patent No.: US 9,479,157 B2
(45) Date of Patent: Oct. 25, 2016

(54) ELECTRIC DEVICE INCLUDING A SWITCH CIRCUIT, A CURRENT LIMIT CIRCUIT AND A CLAMP SWITH, FOR DRIVING A POWER SWITCH

(71) Applicant: Panasonic Intellectual Property Management Co., Ltd., Osaka (JP)

(72) Inventors: Kenji Hanamura, Osaka (JP); Shun Kazama, Osaka (JP); Hajime Hida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/687,953

(22) Filed: Apr. 16, 2015

(65) Prior Publication Data

US 2015/0222262 A1    Aug. 6, 2015

Related U.S. Application Data

(63) Continuation of application No. PCT/JP2014/004222, filed on Aug. 19, 2014.

(30) Foreign Application Priority Data

Aug. 22, 2013  (JP) ................................. 2013-172571
Aug. 22, 2013  (JP) ................................. 2013-172572

(51) Int. Cl.
*H03K 3/00* (2006.01)
*H03K 17/687* (2006.01)
(Continued)

(52) U.S. Cl.
CPC ............. *H03K 17/567* (2013.01); *B60L 3/003* (2013.01); *B60L 7/14* (2013.01); *B60L 11/1803* (2013.01);
(Continued)

(58) Field of Classification Search
CPC ........... H03K 17/687; H03K 17/6871; H03K 17/6872; H03K 17/6874; H03K 17/6877; H03K 5/08; H03K 5/081; H03K 5/08104
USPC ........ 327/108–109, 112, 309, 318, 327, 328, 327/428, 434, 437
See application file for complete search history.

(56) References Cited

U.S. PATENT DOCUMENTS

| 6,720,819 B1 * | 4/2004 | Yamamoto ......... H03K 17/0406 327/427 |
| 7,068,082 B2 * | 6/2006 | Kojima ................ H03K 17/168 327/108 |
| 2013/0200929 A1 | 8/2013 | Sawada et al. |

FOREIGN PATENT DOCUMENTS

| JP | 11-055936 | 2/1999 |
| JP | 2003-158868 | 5/2003 |

(Continued)

OTHER PUBLICATIONS

International Search Report of PCT application No. PCT/JP2014/004222 dated Nov. 18, 2014.

*Primary Examiner* — An Luu
(74) *Attorney, Agent, or Firm* — McDermott Will & Emery LLP

(57) ABSTRACT

A drive device according to one aspect of the disclosure includes a control terminal connector, a switch circuit, a current limit circuit, and a clamp switch on a circuit board. The clamp switch is located in a second quadrant or a fourth quadrant of four quadrants, where the four quadrants are partitioned by two mutually orthogonal virtual lines with the current limit circuit set as an origin and the four quadrants consist of a first quadrant including an area where the control terminal connector is located, the second quadrant, a third quadrant, and the fourth quadrant, in clockwise order.

18 Claims, 17 Drawing Sheets

(51) Int. Cl.

| | |
|---|---|
| *H03K 17/567* | (2006.01) |
| *H02M 7/00* | (2006.01) |
| *H03K 17/0812* | (2006.01) |
| *B60L 3/00* | (2006.01) |
| *B60L 7/14* | (2006.01) |
| *B60L 11/18* | (2006.01) |
| *B60L 15/00* | (2006.01) |
| *H03K 17/08* | (2006.01) |

(52) U.S. Cl.
CPC .......... *B60L 15/007* (2013.01); *H02M 7/003* (2013.01); *H03K 17/08122* (2013.01); *H03K 17/687* (2013.01); *B60L 2210/10* (2013.01); *B60L 2220/14* (2013.01); *H03K 2017/0806* (2013.01); *Y02T 10/645* (2013.01); *Y02T 10/7005* (2013.01); *Y02T 10/7216* (2013.01)

(56) References Cited

FOREIGN PATENT DOCUMENTS

| | | |
|---|---|---|
| JP | 2006-296119 | 10/2006 |
| JP | 2010-075007 | 4/2010 |
| WO | 2012/018073 | 2/2012 |

\* cited by examiner

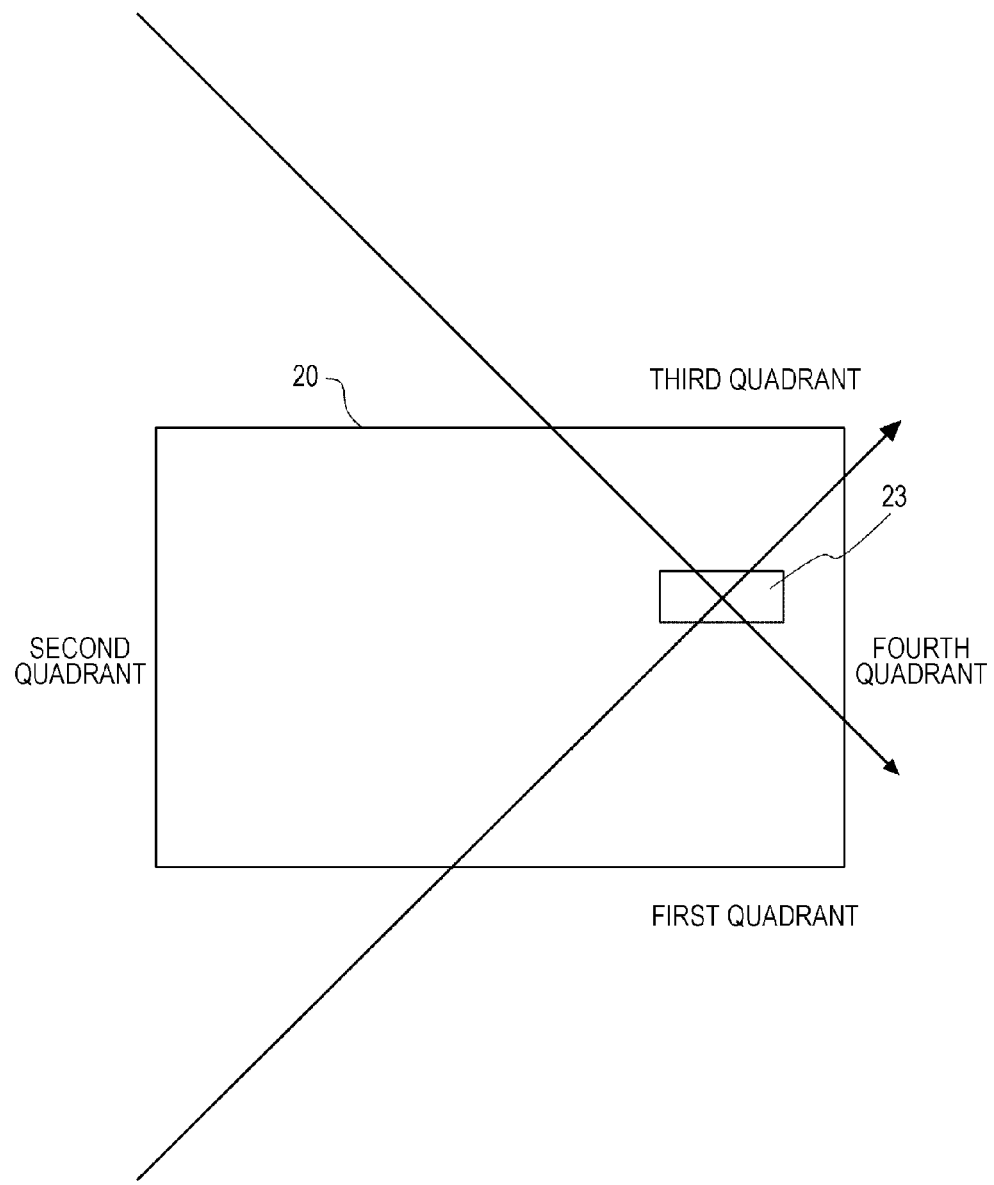

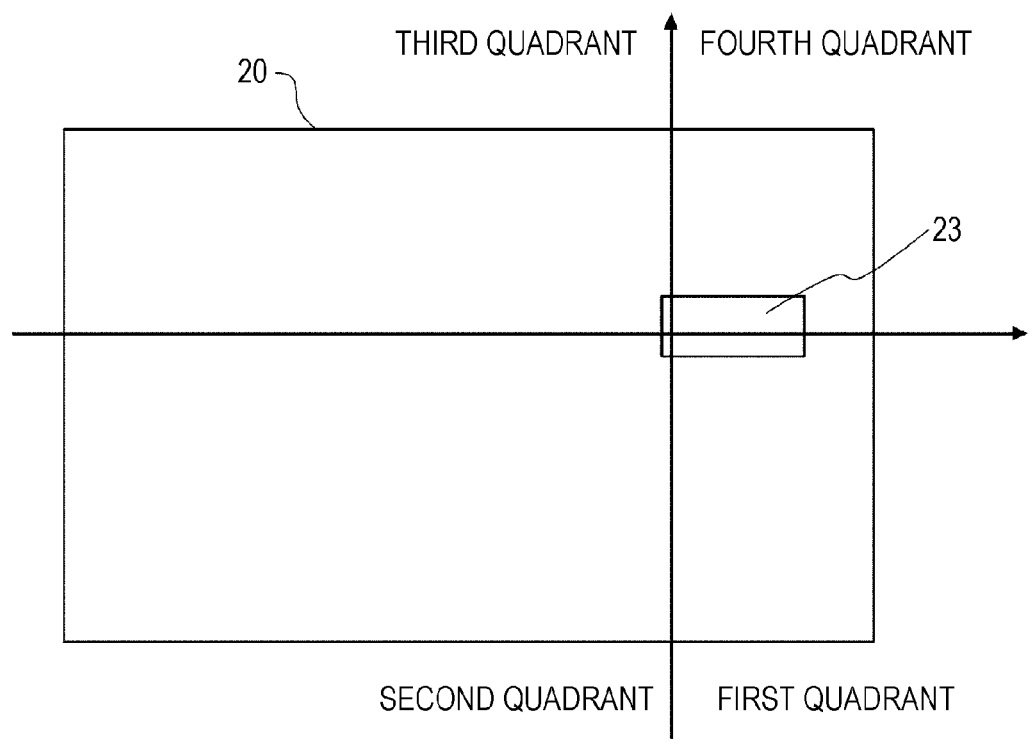

ELECTRIC DEVICE INCLUDING A SWITCH CIRCUIT, A CURRENT LIMIT CIRCUIT AND A CLAMP SWITH, FOR DRIVING A POWER SWITCH

BACKGROUND

1. Technical Field

The present disclosure relates to a drive device for driving a power switch, a power conversion apparatus including the driving device, and a vehicle including the power conversion apparatus.

2. Description of the Related Art

Power switches such as metal oxide semiconductor field effect transistor (MOSFET) and insulated gate bipolar transistor (IGBT) are used for power conversion circuits. Signals generated by a gate drive device are inputted into a control terminal, e.g., a gate terminal, of a power switch and on/off control over the power switch is thereby carried out. In power switches, erroneous firing may be caused by instantaneous current due to parasitic capacitance or the like. As techniques for preventing the erroneous firing, there is a technique in which a switch for clamping is provided in the gate drive circuit (see Japanese Unexamined Patent Application Publication No. 2010-75007, for instance).

SUMMARY

In drive devices, circuit elements may malfunction under influence of heat generation and/or wiring impedance.

One non-limiting and exemplary embodiment provides a drive device in which influence of heat generation and/or wiring impedance upon a clamp switch is reduced.

A drive device according to one aspect of the present disclosure includes: a circuit board; a first potential line that provides first potential, the first potential line being located on the circuit board; a second potential line that provides second potential lower than the first potential, the second potential line being located on the circuit board; a control terminal connector that is located on the circuit board and that is connected to a control terminal of a power switch; a switch circuit that selectively switches whether electric charge is to be supplied to the control terminal of the power switch or is to be drawn from the control terminal of the power switch, the switch circuit being connected between the first potential line and the second potential line on the circuit board; a current limit circuit that is connected between the switch circuit and the control terminal connector on the circuit board; and a clamp switch that is connected between a conductive path, which extends between the control terminal connector and the current limit circuit, and the second potential line on the circuit board, wherein the clamp switch is located in a second quadrant or a fourth quadrant of four quadrants on the circuit board, where the four quadrants are partitioned by two mutually orthogonal virtual lines with the current limit circuit set as an origin and the four quadrants consist of a first quadrant including an area where the control terminal connector is located, the second quadrant, a third quadrant, and the fourth quadrant, in clockwise order.

According to the disclosure, the influence of the heat generation and/or the wiring impedance on the clamp switch provided in the drive device can be reduced.

It should be noted that comprehensive or specific embodiments may be implemented as a system, a method, a drive circuit, a power conversion apparatus, a vehicle, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 16 is a diagram illustrating modification 1 of partition of the gate drive circuit into areas; and FIG. 17 is a diagram illustrating modification 2 of partition of a gate drive circuit board into areas.

DETAILED DESCRIPTION

Figure 1:
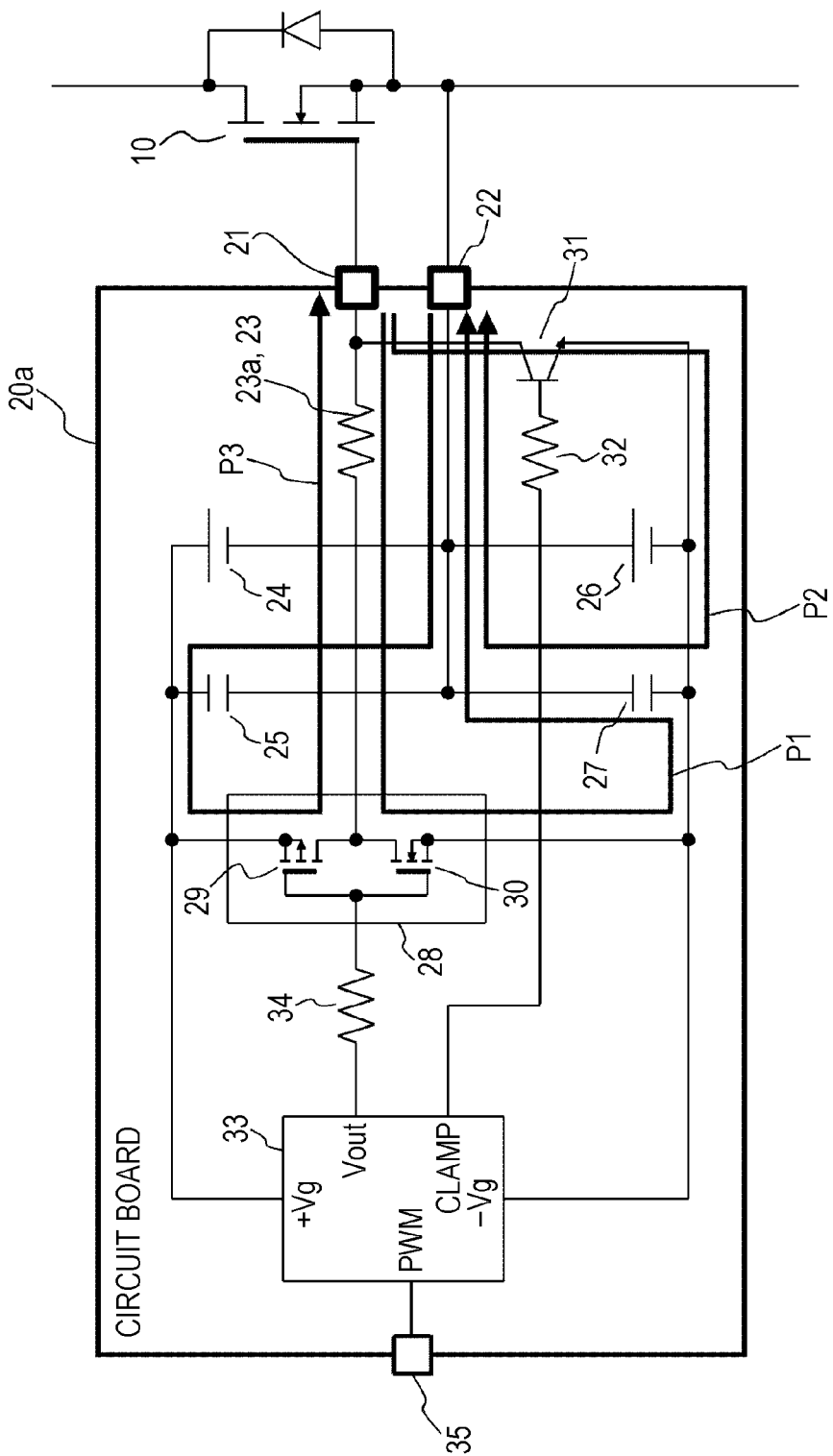
FIG. 1 is a diagram illustrating an example of a configuration of a gate drive circuit according to embodiment 1.

A drive device according to first aspect of the disclosure, which is a drive device that drives a power switch, includes a circuit board, a first potential line that is placed on the circuit board and that provides first potential, a second potential line that is placed on the circuit board and that provides second potential lower than the first potential, a control terminal connector that is placed on the circuit board and that is connected to a control terminal of the power switch, a charging/discharging switch circuit that is connected between the first potential line and the second potential line on the circuit board and that selectively switches whether electric charge is to be supplied to the control terminal of the power switch or is to be drawn from the control terminal of the power switch, a current limit circuit that is connected between the charging/discharging switch circuit and the control terminal connector on the circuit board, and a clamp switch that is connected between a wiring line, which extends between the control terminal connector and the current limit circuit, and the second potential line on the circuit board and that opens and closes conduction between the control terminal and the second potential line. The clamp switch is placed in a second quadrant or a fourth quadrant which are two of four quadrants on a principal surface of the circuit board, where the four quadrants are partitioned by two mutually orthogonal virtual lines with the current limit circuit set as an origin and the four quadrants consist of a first quadrant including an area where the control terminal connector is placed, a second quadrant, a third quadrant, and a fourth quadrant, in clockwise order.

On condition that the current limit circuit located at the origin and the control terminal connector located in the first quadrant serve as heat sources, the clamp switch is placed in the second quadrant or the fourth quadrant. Thus wiring impedance between the clamp switch and the control terminal connector can be reduced while the clamp switch is placed far from the heat sources. Increase in switching time for the clamp switch can be curbed, for instance, by reduction in influence of heat and the wiring impedance upon the clamp switch.

In the drive device according to the first aspect of the disclosure, the clamp switch may bring about nonconduction between the control terminal and the second potential line when electric charge is supplied from the first potential line to the control terminal of the power switch, and may bring about conduction between the control terminal and the second potential line when electric charge is drawn from the control terminal of the power switch to the second potential line, for instance.

Thus the power switch can stably be kept in off-state.

In the drive device according to the first aspect of the disclosure, the clamp switch and the second potential line may be placed in the same quadrant, for instance.

Thus wiring impedance between the clamp switch and the second potential line can be reduced. Therefore, a current that flows from the control terminal of the power switch into the control terminal connector of the drive device is more likely to flow from the control terminal connector through the clamp switch to the second potential line. As a result, an instantaneous current that flows from the control terminal connector into the charging/discharging switch circuit can be reduced and thus erroneous firing of the power switch can be reduced, for instance.

In the drive device according to the first aspect of the disclosure, the charging/discharging switch circuit may be placed in the third quadrant, for instance.

Thus influence the control terminal connector that is the heat source exerts upon the charging/discharging switch circuit can be reduced. As a result, switching speed and output current of the charging/discharging switch circuit can be stabilized, for instance.

In the drive device according to the first aspect of the disclosure, the charging/discharging switch circuit may include a charging switch that opens and closes conduction between the first potential line and the control terminal connector and a discharging switch that opens and closes conduction between the control terminal connector and the second potential line, for instance.

When the charging switch is in open state, accordingly, a current flows from the first potential line to the power switch and the power switch is charged. When the discharging switch is in open state, the power switch is discharged and a current flows from the power switch to the second potential line. The charging/discharging switch circuit may be an element that is one chip into which the charging switch and the discharging switch are integrated, for instance.

The drive device according to the first aspect of the disclosure may further include a conduction terminal connector that is placed on the circuit board and that is connected to a first conduction terminal or a second conduction terminal of the power switch, for instance, and the conduction terminal connector may be placed in the first quadrant.

The conduction terminal connector and the control terminal connector, both of which may become the heat source, are placed in the first quadrant, and other circuit elements placed at positions far from the first quadrant. This can reduce the influence of the heat.

The drive device according to the first aspect of the disclosure may further include a capacitor that is connected between the conduction terminal connector and the second potential line on the circuit board, for instance, and the capacitor may be placed in vicinity of the clamp switch.

Thus wiring impedance between the conduction terminal connector and the capacitor can be reduced. Accordingly, the current that flows from the control terminal of the power switch into the control terminal connector of the drive device is likely to flow through a path extending from the control terminal connector through the clamp switch, the second potential line, and the capacitor to the conduction terminal connector. As a result, the instantaneous current that flows from the control terminal connector into the charging/discharging switch circuit can be reduced, for instance, and thus the erroneous firing of the power switch can be reduced.

In the drive device according to the first aspect of the disclosure, at least a portion of the wiring line extending between the control terminal connector and the current limit circuit may be placed in either of the second quadrant or the fourth quadrant where the clamp switch is placed, for instance.

Thus the current that flows from the control terminal of the power switch into the control terminal connector of the drive device is likely to flow through the clamp switch. As a result, the instantaneous current that flows from the control terminal connector into the charging/discharging switch circuit can be reduced, for instance, and thus the erroneous firing of the power switch can be reduced.

A drive device according to second aspect of the disclosure, which is a drive device that drives a power switch, includes a circuit board, a first potential line that is placed on the circuit board and that provides first potential, a second potential line that is placed on the circuit board and that provides second potential lower than the first potential, a control terminal connector that is placed on the circuit board and that is connected to a control terminal of the power switch, a conduction terminal connector that is placed on the circuit board and that is connected to a first conduction terminal or a second conduction terminal of the power switch, a charging/discharging switch circuit that is connected between the first potential line and the second potential line on the circuit board and that selectively switches whether electric charge is to be supplied to the control terminal of the power switch or is to be drawn from the control terminal of the power switch, a first current limit circuit that is connected between the charging/discharging switch circuit and the control terminal connector on the circuit board, a clamp switch that is connected between a wiring line, which extends between the control terminal connector and the first current limit circuit, and the second potential line on the circuit board and that opens and closes conduction between the control terminal and the second potential line, and a second current limit circuit that is connected between the wiring line, which extends between the control terminal connector and the first current limit circuit, and a clamp control terminal of the clamp switch on the circuit board. The clamp switch, the second current limit circuit, and a wiring line extending between the clamp switch and the second current limit circuit are placed out of a first area and a second area, where the first area is obtained from extension of a region where the first current limit circuit is placed in both directions orthogonal to a direction of a current that flows through the first current limit circuit on a principal surface of the circuit board, and the second area is obtained from extension of the control terminal connector, the conduction terminal connector, and an area therebetween in both directions orthogonal to a direction of a straight line passing through the control terminal connector and the conduction terminal connector.

Thus the clamp switch, the second current limit circuit, and the wiring line extending between the clamp switch and the second current limit circuit are resistant to influence of a magnetic field generated by the current that flows through the first current limit circuit and a magnetic field generated by a current that flows through the control terminal connector and/or the conduction terminal connector. Consequently, malfunction of the drive device can be reduced.

In the drive device according to the second aspect of the disclosure, the wiring lines extending between the clamp switch and the second current limit circuit may include a wiring line extending between the clamp control terminal of the clamp switch and the second current limit circuit and a wiring line extending between a clamp conduction terminal of the clamp switch and the second current limit circuit, for instance.

In the drive device according to the second aspect of the disclosure, the clamp switch may bring about nonconduction between the control terminal and the second potential line when electric charge is supplied from the first potential line to the control terminal of the power switch, and may bring about conduction between the control terminal and the second potential line when electric charge is drawn from the control terminal of the power switch to the second potential line, for instance.

Thus the power switch can stably be kept in off-state.

In the drive device according to the second aspect of the disclosure, the clamp switch is placed at a position that is nearer to the control terminal connector than the charging/discharging switch circuit, for instance.

Thus wiring impedance from the control terminal connector to the clamp switch that is viewed from the control terminal connector can be lower than wiring impedance from the control terminal connector to the charging/discharging switch circuit that is viewed from the control terminal connector. Therefore, a current that flows from the control terminal of the power switch into the control terminal connector of the drive device is likely to flow from the control terminal connector through the clamp switch to the second potential line. As a result, an instantaneous current that flows from the control terminal connector into the charging/discharging switch circuit can be reduced, for instance, and thus the erroneous firing of the power switch can be reduced.

In the drive device according to the second aspect of the disclosure, the charging/discharging switch circuit may be placed in a third quadrant of four quadrants, and the clamp switch may be placed in a second quadrant or a fourth quadrant of the four quadrants, where the four quadrants are partitioned by two mutually orthogonal virtual lines with the first current limit circuit set as an origin and the four quadrants consist of a first quadrant being an area where the control terminal connector is placed, the second quadrant, the third quadrant, and the fourth quadrant, in clockwise order.

On condition that the current limit circuit located at the origin and the control terminal connector located in the first quadrant serve as heat sources, the clamp switch is placed in the second quadrant or the fourth quadrant. Thus the wiring impedance between the clamp switch and the control terminal connector can be reduced while the clamp switch is placed far from the heat sources. Increase in switching time for the clamp switch can be curbed, for instance, by reduction in influence of heat and the wiring impedance upon the clamp switch.

The drive device according to the second aspect of the disclosure may further include metal members placed on the circuit board, for instance, the charging/discharging switch circuit may include a charging switch that opens and closes conduction between the first potential line and the control terminal connector and a discharging switch that opens and closes conduction between the second potential line and the control terminal connector, and the metal members may be placed between the clamp switch and the discharging switch.

The metal members shield a magnetic field generated by a current that flows in vicinity of the discharging switch and thereby protect the clamp switch. Consequently, the malfunction of the drive device can be reduced.

In the drive device according to the second aspect of the disclosure, the metal members may be, for instance, portions of a capacitor that is connected between the conduction terminal connector and the second potential line, and the clamp switch, the second current limit circuit, and the wiring line extending between the clamp switch and the second current limit circuit may be placed further out of a third area, where the third area is obtained from extension of an area where the capacitor is placed on the principal surface of the circuit board in both directions orthogonal to a direction of a straight line passing through a positive terminal and a negative terminal of the capacitor.

The metal members included in the capacitor shield the magnetic field generated by the current that flows in vicinity of the discharging switch and thereby protect the clamp switch. Consequently, the malfunction of the drive device can be reduced.

A power conversion apparatus according to third aspect of the disclosure includes a power conversion circuit including the power switch and the drive device described above.

A vehicle according to fourth aspect of the disclosure includes a battery that outputs first direct-current power, a DC-DC converter that converts the first direct-current power inputted from the battery into second direct-current power and that outputs the second direct-current power, an inverter that converts the second direct-current power inputted from the DC-DC converter into alternating-current power and that outputs the alternating-current power, and a motor that is driven by the alternating-current power inputted from the inverter, and at least one of the DC-DC converter and the inverter includes the power conversion apparatus described above.

A vehicle according to fifth aspect of the disclosure includes a battery that outputs first direct-current power, an inverter that converts the first direct-current power inputted from the battery into alternating-current power and that outputs the alternating-current power, and a motor that is driven by the alternating-current power inputted from the inverter, and the inverter includes the power conversion apparatus described above.

Hereinbelow, embodiments of the disclosure will be described with reference to the drawings. For all the drawings for description on the embodiments, members having the same function are provided with the same reference characters in principle and iterative description thereon is omitted.

The embodiments that will be described below each designate a comprehensive or specific example. Numerical values, shapes, materials, components, layouts and connection configurations of the components, and the like that will be mentioned for the embodiments below each offer an example and are not intended to limit the disclosure. The components of the embodiments below that are not mentioned in independent claims providing for the broadest concepts will be described as optional components.

Embodiment 1

FIG. 1 is a diagram illustrating an example of a configuration of a gate drive circuit according to embodiment 1 of the disclosure. The gate drive circuit 1000a is a circuit for driving a power switch 10. The power switch 10 includes a control terminal, a first conduction terminal, and a second conduction terminal, for instance. The power switch 10 may be a gate insulating transistor, for instance. The gate insulating transistor may be MOSFET or IGBT that is made from Si, SiC, or GaN, for instance. On condition that the power switch 10 is MOSFET, the control terminal corresponds to a gate terminal, one of the first conduction terminal and the second conduction terminal corresponds to a source terminal, and the other corresponds to a drain terminal. On condition that the power switch 10 is IGBT, the control terminal corresponds to a gate terminal, one of the first conduction terminal and the second conduction terminal corresponds to an emitter terminal, and the other corresponds to a collector terminal. The power switch 10 may be a bipolar transistor. In that case, the control terminal corresponds to a base, one of the first conduction terminal and the second conduction terminal corresponds to an emitter, and the other corresponds to a collector. Hereinbelow, the example in which the power switch 10 is MOSFET will be described.

The gate drive circuit 1000a includes a gate terminal connector 21, a source terminal connector 22, a current limit circuit 23, a charging switch 29, a discharging switch 30, a clamp switch 31, a clamp resistor 32, a positive bias power supply 24, a positive bias capacitor 25, a negative bias power supply 26, a negative bias capacitor 27, a charging/discharging resistor 34, a drive circuit 33, and an external signal connector 35, on a circuit board 20a. The gate drive circuit 1000a may selectively apply a positive bias voltage and a negative bias voltage between the gate and the source of the power switch 10, based on potential at the source terminal of the power switch 10. For instance, on-voltage the gate drive circuit 1000a outputs is set at +Vg=20 V and off-voltage is set at −Vg=−5 V.

The gate terminal connector 21 is an example of the control terminal connector. The source terminal connector 22 is an example of the conduction terminal connector. The charging switch 29 and the discharging switch 30 form a charging/discharging switch circuit 28. In the charging/discharging switch circuit 28, the charging switch 29 and the discharging switch 30 do not have to be placed close to each other.

The gate terminal connector 21 is connected to the gate terminal of the power switch 10 that is the control terminal. The source terminal connector 22 is connected to the source terminal of the power switch 10 that is one of the conduction terminals. A current is inputted into or outputted from the source terminal in accordance with status of the power switch 10. The current limit circuit 23 is provided on a current path extending to the gate terminal connector 21 and regulates switching speed of the power switch 10. The current limit circuit 23 may be a resistor, a diode, or a capacitor or may be a combination thereof. For instance, the current limit circuit 23 may include a combination of a plurality of resistors, a combination of a resistor and a diode, or a combination of a resistor and a capacitor. In case where the current limit circuit 23 includes a combination of a plurality of elements, the switching speed of the power switch 10 at time when the power switch 10 is turned on and the switching speed of the power switch 10 at time when the power switch 10 is turned off can separately be regulated. FIG. 1 illustrates the example in which the current limit circuit 23 is a single gate resistance 23a.

A positive terminal of the positive bias power supply 24 is connected to a high-side reference potential line on the circuit board 20a and a negative terminal of the positive bias power supply 24 is connected to a wiring line extending to the source terminal connector 22. The positive bias capacitor 25 is connected between the high-side reference potential line and the line extending to the source terminal connector 22 so as to be in parallel with the positive bias power supply 24. The positive bias capacitor 25 smoothes power supply voltage of the positive bias power supply 24. A positive terminal of the negative bias power supply 26 is connected to the line extending to the source terminal connector 22 and a negative terminal of the negative bias power supply 26 is connected to a low-side reference potential line on the circuit board 20a. The negative bias capacitor 27 is connected between the line extending to the source terminal connector 22 and the low-side reference potential line so as to be in parallel with the negative bias power supply 26. The negative bias capacitor 27 smoothes power supply voltage of the negative bias power supply 26.

The high-side reference potential line is an example of the first potential line. The low-side reference potential line is an example of the second potential line. In the example illustrated in FIG. 1, the high-side reference potential line is a positive bias potential line and the low-side reference potential line is a negative bias potential line.

The source terminal connector 22 is connected to the source terminal of the power switch 10. Thus source potential of the power switch 10 is equal to reference potential of the positive bias power supply 24, the positive bias capacitor 25, the negative bias power supply 26, and the negative bias capacitor 27.

The charging switch 29 is an element for charging the power switch 10 and the discharging switch 30 is an element for discharging the power switch 10. The clamp switch 31 is an element for preventing the erroneous firing of the power switch 10. The charging switch 29, the discharging switch 30, and the clamp switch 31 may be bipolar transistors or MOSFETs that are made from Si, SiC, GaN, or the like, for instance. The charging switch 29 and the discharging switch 30 may be integrated into an IC as in the charging/discharging switch circuit 28 illustrated in FIG. 1.

The charging switch 29 includes an input terminal, an output terminal, and a conduction control terminal for controlling conduction between the input terminal and the output terminal. The charging switch 29 may be a p-type MOSFET, for instance. The input terminal of the charging switch 29 is connected to the high-side reference potential line, the output terminal thereof is connected through the gate resistance 23a to the gate terminal connector 21, and the conduction control terminal thereof is connected through the charging/discharging resistor 34 to Vout terminal of the drive circuit 33. The charging switch 29 charges the gate of the power switch 10 with electric charge through the gate resistance 23a and the gate terminal connector 21 from the high-side reference potential line connected to the positive bias power supply 24.

The discharging switch 30 includes an input terminal, an output terminal, and a conduction control terminal for controlling conduction between the input terminal and the output terminal. The discharging switch 30 may be an n-type MOSFET, for instance. The input terminal of the discharging switch 30 is connected through the gate resistance 23a to the gate terminal connector 21, the output terminal thereof is connected to the low-side reference potential line, and the conduction control terminal thereof is connected through the charging/discharging resistor 34 to the Vout terminal of the drive circuit 33. The discharging switch 30 discharges electric charge from the gate of the power switch 10 through the gate terminal connector 21 and the gate resistance 23a to the low-side reference potential line connected to the negative bias power supply 26.

The clamp switch 31 includes an input terminal, an output terminal, and a conduction control terminal for controlling conduction between the input terminal and the output terminal. The clamp switch 31 may be an n-type MOSFET, for instance. The input terminal of the clamp switch 31 is connected to a node between the gate terminal connector 21 and the gate resistance 23a, the output terminal thereof is connected to the low-side reference potential line, and the conduction control terminal thereof is connected through the clamp resistor 32 to CLAMP terminal of the drive circuit 33.

Positive power terminal of the drive circuit 33 is connected to the high-side reference potential line and negative power terminal thereof is connected to the low-side reference potential line. PWM terminal of the drive circuit 33 is connected to the external signal connector 35. The Vout terminal of the drive circuit 33 is connected through the charging/discharging resistor 34 to the conduction control terminal of the charging switch 29 and to the conduction control terminal of the discharging switch 30. The drive circuit 33 includes an insulator such as photocoupler.

Hereinbelow, relations between operations of the drive circuit 33 and operations of the power switch 10 will be described. A control signal, e.g., PWM control signal, is inputted from an external control circuit (not illustrated) into the PWM terminal of the drive circuit 33. In the drive circuit 33, voltage at the Vout terminal is set in accordance with the signal inputted through the PWM terminal. Specifically, the Vout terminal outputs positive bias potential +Vg when logical value of the PWM terminal signal is "H". As a result, the charging switch 29 is turned on, the gate of the power switch 10 is charged with electric charge through the gate resistance 23a, and the power switch 10 is turned on. When the logical value of the PWM terminal signal is "L", the Vout terminal outputs negative bias potential −Vg. As a result, the discharging switch 30 is turned on, electric discharge from the gate of the power switch 10 is carried out through the gate resistance 23a, and the power switch 10 is turned off.

Figure 2:
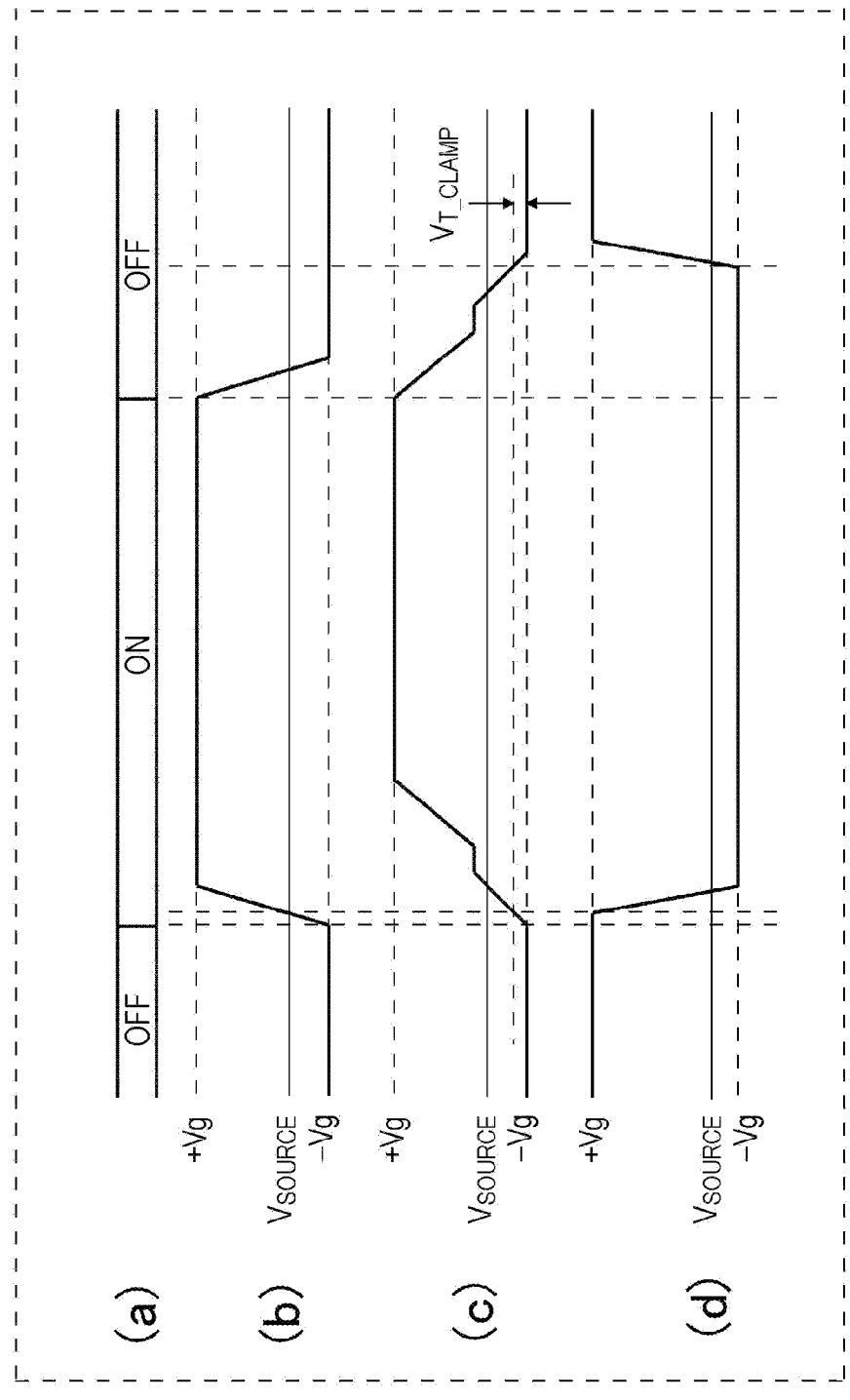
FIG. 2 is timing diagram for describing an example of operation of a clamp switch.

FIG. 2 is timing diagram for describing an example of operation of the clamp switch 31. Part (a) of FIG. 2 illustrates transition of the logical value at the PWM terminal of the drive circuit 33. Part (b) of FIG. 2 illustrates transition of the voltage outputted from the Vout terminal. Part (c) of FIG. 2 illustrates transition of gate-source voltage in the power switch 10. Part (d) of FIG. 2 illustrates transition of voltage at the CLAMP terminal.

As illustrated in parts (c) and (d) of FIG. 2, the voltage at the CLAMP terminal changes in accordance with the gate-source voltage in the power switch 10. When the gate-source voltage in the power switch 10 is equal to or higher than a threshold voltage Vt_CLAMP, the CLAMP terminal of the drive circuit 33 outputs the negative bias potential −Vg and the clamp switch 31 is turned off. When the gate-source voltage in the power switch 10 is lower than the threshold voltage Vt_CLAMP, the CLAMP terminal outputs the positive bias potential +Vg and the clamp switch 31 is turned on. That is, the clamp switch 31 is in off-state in periods when the power switch 10 is in on-state and the clamp switch 31 is in on-state in periods when the power switch 10 is in off-state. When the clamp switch 31 is turned on, the gate-source voltage in the power switch 10 is clamped to the negative bias potential −Vg provided by the low-side reference potential line. The threshold voltage Vt_CLAMP described above is set at a value determined based on results of experiments or simulations or empirical rules designers have.

As illustrated in FIG. 1, a discharge path P1 is a current path that extends from the gate terminal connector 21, through a wiring line, the gate resistance 23a, a wiring line, the discharging switch 30, a wiring line, the negative bias capacitor 27, and a wiring line to the source terminal connector 22. A clamp path P2 is a current path that extends from the gate terminal connector 21, through a wiring line, the clamp switch 31, a wiring line, the negative bias capacitor 27, and the wiring line to the source terminal connector 22. The clamp path P2 is designed so as to have lower impedance than the discharge path P1 has. Thus the power switch 10 can be restrained from being erroneously turned on when the Vout terminal gives the potential for controlling the power switch 10 into off-state.

For instance, an instantaneous current may flow from the gate terminal of the power switch 10 toward the gate terminal connector 21. The instantaneous current flows into the gate drive circuit 1000a through a parasitic capacitance that arises between the drain terminal and the gate terminal of the power switch 10. When the instantaneous current flows from the gate terminal of the power switch 10 through the discharge path P1 via the gate resistance 23a, gate-source voltage of the discharging switch 30 is increased by voltage drop in the gate resistance 23a and voltage drop in on-resistance of the discharging switch 30. This may cause the erroneous firing of the power switch 10.

In the gate drive circuit 1000a having the clamp path P2 including the clamp switch 31, however, the instantaneous current flows through the clamp path P2. Accordingly, decrease in the impedance of the clamp path P2 in design causes decrease in voltage drop through the clamp path P2 and decrease in amount of increase in the gate-source voltage in the power switch 10. Therefore, provision of the clamp path P2 having the low impedance makes it possible to maintain off-state of the power switch 10 even if the instantaneous current flows.

Subsequently, characteristics of the charging switch 29, the discharging switch 30, and the clamp switch 31 will be described. Switching speeds and stability in output currents are demanded of the charging switch 29, the discharging switch 30, and the clamp switch 31. Switch made from Si, SiC, or GaN has characteristics in that turn-on and turn-off are delayed with increase in temperature and in that output currents decrease with the increase in temperature.

Influence of heat from heat sources on the circuit board 20a upon the charging switch 29, the discharging switch 30, and the clamp switch 31 is reduced by placement of the charging switch 29, the discharging switch 30, and the clamp switch 31 far from the heat sources. Such placement, however, may increase the wiring impedance of the gate drive circuit 1000. Increase in wiring inductance in the wiring impedance causes increase in counter-electromotive force L(di/dt) when the instantaneous current flows from the gate terminal of the power switch 10 toward the gate terminal connector 21. When voltage drop due to inductance component is superimposed on voltage drop due to wiring resistance component, the voltage drop in the current path through which the instantaneous current flows is further increased.

That is, the influence of the heat and the influence of the wiring impedance are in trade-off relation for the charging switch 29, the discharging switch 30, and the clamp switch 31. In the relation, decrease in the influence of the heat causes increase in the influence of the wiring impedance, whereas decrease in the influence of the wiring impedance causes increase in the influence of the heat.

The inventors analyzed heat sources and the wiring impedance in the gate drive circuit 1000a. Initially, the heat sources will be described. Three major heat sources in the gate drive circuit 1000a are the gate resistance 23a, the gate terminal connector 21, and the source terminal connector 22. The gate resistance 23a becomes a heat source due to charge and discharge of the gate of the power switch 10. The gate terminal connector 21 and the source terminal connector 22 become heat sources due to transmission of loss in the power switch 10 via the gate terminal and the source terminal.

Subsequently, the wiring impedance will be described. FIG. 1 illustrates a current path at time of the charge of the gate of the power switch 10 as a charge path P3, the current path at time of the discharge of the gate as the discharge path P1, and the current path for coping with the erroneous firing as the clamp path P2. The charge path P3 is a current path that extends from the positive bias capacitor 25, through a wiring line, the charging switch 29, a wiring line, the gate resistance 23a, the wiring line, the gate terminal connector 21, the power switch 10, the source terminal connector 22, and the wiring line to the positive bias capacitor 25. The discharge path P1 and the clamp path P2 are as described above. Impedance of each of the paths is as follows.

The impedance of the charge path P3 will be described below. The charge path P3 has a component impedance Zp4 that is sum of on-resistance of the charging switch 29, the gate resistance 23a, equivalent series resistance (ESR) which is a parasitic component of the positive bias capacitor 25, and equivalent series inductance (ESL) which is a parasitic component of the positive bias capacitor 25. The charge path P3 further has a wiring impedance ZI4 that is sum of wiring resistance and wiring inductance at time when electrical connection between the source terminal connector 22 and a component, between components, and between a component and the gate terminal connector 21 is made. The wiring impedance ZI4 is impedance based on all the wiring lines in the charge path P3. Total impedance of the charge path P3 can be defined by synthetic impedance Z44 that is sum of the component impedance Zp4 and the wiring impedance ZI4.

The impedance of the discharge path P1 will be described below. The discharge path P1 has a component impedance Zp2 that is sum of on-resistance of the discharging switch 30, the gate resistance 23a, ESR of the negative bias capacitor 27, and ESL of the negative bias capacitor 27. The discharge path P1 has a wiring impedance ZI2 that is sum of wiring resistance and wiring inductance at time when electrical connection between the gate terminal connector 21 and a component, between components, and between a component and the source terminal connector 22 is made. The wiring impedance ZI2 is impedance based on all the wiring lines in the discharge path P1. Total impedance of the discharge path P1 can be defined by synthetic impedance Z42 that is sum of the component impedance Zp2 and the wiring impedance ZI2.

The impedance of the clamp path P2 will be described below. The clamp path P2 has a component impedance Zp3 that is sum of on-resistance of the clamp switch 31, ESR of the negative bias capacitor 27, and ESL of the negative bias capacitor 27. The clamp path P2 has a wiring impedance ZI3 that is sum of wiring resistance and wiring inductance at time when electrical connection between the gate terminal connector 21 and a component, between components, and between a component and the source terminal connector 22 is made. The wiring impedance ZI3 is impedance based on all the wiring lines in the clamp path P2. Total impedance of the clamp path P2 can be defined by synthetic impedance Z43 that is sum of the component impedance Zp3 and the wiring impedance ZI3.

The impedance of each of the paths is as described above. Thus the heat sources and the synthetic impedance in the gate drive circuit 1000a have successfully been identified. Based on above findings, the inventors examined placement of the charging switch 29, the discharging switch 30, and the clamp switch 31 in order to reduce the influence of the heat and the synthetic impedance upon the charging switch 29, the discharging switch 30, and the clamp switch 31.

Initially, a method of reducing the influence of the synthetic impedance will be described. Description on the component impedance will be given first. The component impedance can be reduced by use of the charging switch 29, the discharging switch 30, and the clamp switch 31 that have low on-resistances, for instance. In addition, the component impedance can be reduced by use of the positive bias capacitor 25 and the negative bias capacitor 27 that are low in ESR and ESL, for instance.

Subsequently, description on the wiring impedance will be given. The wiring impedance can be reduced by use of the circuit board 20a formed of a multilayer board in which one layer is a solid pattern and is a layer that provides the source potential of the power switch 10, for instance. That is, there are a great number of connecting points on the layer that provides the source potential of the power switch 10 and thus the wiring impedance can be reduced by provision of the layer as the solid pattern in comparison with connection of the layer by a plurality of thin wiring lines. Wiring lines for others than the source potential in the charge path P3, the discharge path P1, and the clamp path P2 may be formed on a layer on top of the solid pattern for the source potential, for instance. As a result, magnetic fields are canceled with each other, and thus the wiring impedance can be reduced.

Subsequently, the wiring impedance of each of the current paths will be described. Initially, the wiring impedance of the charge path P3 will be described. The wiring impedance is reduced by decrease in lengths and increase in widths of the wiring lines extending from the positive bias capacitor 25 through the charging switch 29 to the gate resistance 23a. The wiring impedance is reduced by particular decrease in the length and increase in the width of the wiring line extending from the gate resistance 23a to the gate terminal connector 21. The wiring impedance of the charge path P3 can be reduced by provision of such a wiring pattern.

Subsequently, the wiring impedance of the discharge path P1 will be described. The wiring impedance is reduced by decrease in lengths and increase in widths of the wiring lines extending from the negative bias capacitor 27 through the discharging switch 30 to the gate resistance 23a. The wiring impedance is reduced by particular decrease in the length and increase in the width of the wiring line extending from the gate resistance 23a to the gate terminal connector 21. The wiring impedance of the discharge path P1 can be reduced by provision of such a wiring pattern.

Finally, the wiring impedance of the clamp path P2 will be described. The wiring impedance is reduced by decrease in lengths and increase in widths of wiring lines extending from the gate terminal connector 21 through the clamp switch 31 to the negative bias capacitor 27. In particular, the wiring impedance of the clamp path P2 may be smaller because the clamp path P2 has a function of preventing the erroneous firing of the power switch 10. The wiring impedance of the clamp path P2 can be reduced by provision of such a wiring pattern.

The wiring impedance of the paths can be reduced by the provision of such wiring patterns as described above. The clamp path P2 and the discharge path P1 are designed so that the synthetic impedance Z43 of the clamp path P2 is smaller than the synthetic impedance Z42 of the discharge path P1.

Figure 3:
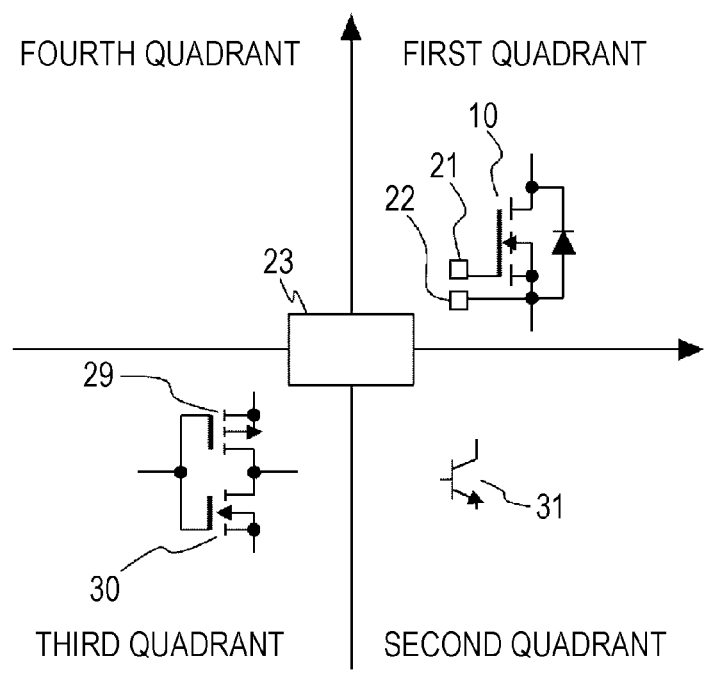
FIG. 3 is a diagram for describing an example of a layout configuration of the gate drive circuit.

Subsequently, the influence of the heat will be described. FIG. 3 is a diagram for describing an example of a layout configuration of the gate drive circuit. As illustrated in FIG. 3, the gate drive circuit is partitioned into four quadrant areas with the current limit circuit 23 set as an origin. The areas are respectively defined as a first quadrant, a second quadrant, a third quadrant, and a fourth quadrant in clockwise order. The current limit circuit 23 is the greatest heat source in the gate drive circuit 1000a, for instance.

Figure 4:
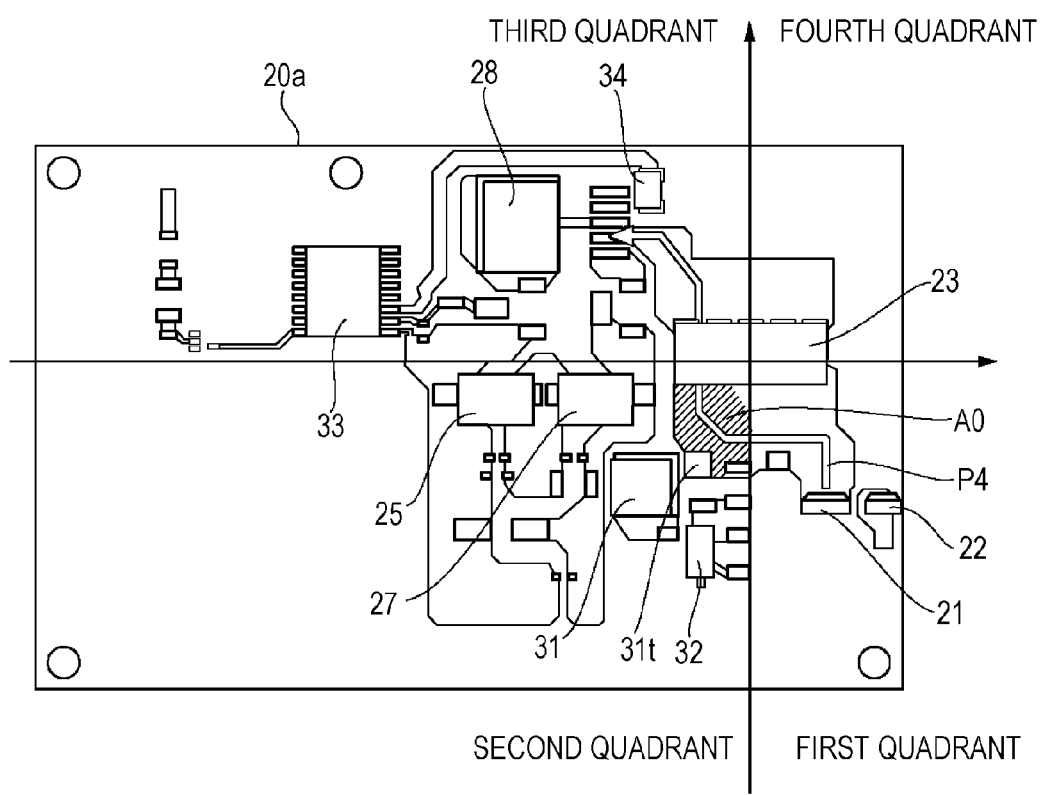
FIG. 4 is a diagram illustrating an example of a component layout and a wiring pattern of the gate drive circuit according to embodiment 1.

As illustrated in FIG. 4, the four quadrant areas are partitioned by two virtual lines that cross at right angles on the current limit circuit 23.

The gate terminal connector 21 and the source terminal connector 22 are placed in the first quadrant. In this configuration, there are the heat sources on the origin and in the first quadrant and heat radially propagates from the heat sources on the circuit board 20a. The first quadrant is a quadrant in which increase in temperature is the largest due to synthesis of heat generation by the current limit circuit 23 and heat generation by the gate terminal connector 21 and the source terminal connector 22. The second quadrant and the fourth quadrant that are on both sides of the first quadrant are quadrants in which the increase in the temperature is the second largest. The third quadrant is a quadrant in which the increase in the temperature is the smallest.

In other words, the two mutually orthogonal virtual lines, an intersection point of which is located at the current limit circuit 23, are set so as to extend in directions that do not pass through the gate terminal connector 21 and the source terminal connector 22. Among the four quadrants partitioned by the virtual lines, the area including the gate terminal connector 21 and the source terminal connector 22 is defined as the first quadrant. The first quadrant may be defined based on only the gate terminal connector 21, and the source terminal connector 22 may be placed in the areas other than the first quadrant.

In consideration of such a relation between the heat and the wiring impedance as described above, the inventors examined the placement of the charging switch 29, the discharging switch 30, and the clamp switch 31 and consequently found out following placement.

The charging switch 29 and the discharging switch 30 are placed in the third quadrant in which the influence of the heat is the smallest. The wiring impedance can further be reduced by placement of the charging switch 29 and the discharging switch 30 in vicinity of the current limit circuit 23 in the third quadrant.

On condition that the clamp switch 31 is placed in the third quadrant in which the influence of the heat is the smallest, the amount of increase in the gate-source voltage in the power switch 10 is likely to go up due to the instantaneous current described above and the wiring impedance of the path through which the instantaneous current flows. Therefore, the clamp switch 31 is placed in the second or fourth quadrant in which the influence of the heat is the second smallest. The wiring impedance between the clamp switch 31 and the gate terminal connector 21 can be reduced by placement of the clamp switch 31 in vicinity of the first quadrant in the second or fourth quadrant.

The influence of the heat the second quadrant receives may be different from the influence of the heat the fourth quadrant receives. Under such a condition, the clamp switch 31 may be placed in the quadrant in which the influence of the heat is the second or third smallest. In order to reduce the influence of the heat, the clamp switch 31 may be placed in either of the second or fourth quadrant that is the less likely to be influenced by the heat.

The clamp switch 31 is connected between the wiring line extending between the gate terminal connector 21 and the current limit circuit 23 and the low-side reference potential line. Accordingly, the clamp path P2 can be shortened and the wiring impedance of the clamp path P2 can be reduced by placement of the clamp switch 31 in either of the second or fourth quadrant where the low-side reference potential line extends. In the embodiment, the low-side reference potential line does not extend in the fourth quadrant but extends in the second quadrant and the clamp switch 31 is therefore placed in the second quadrant.

The negative bias capacitor 27 is placed in vicinity of the clamp switch 31. In addition, the negative bias capacitor 27 is placed between the clamp switch 31 and the discharging switch 30. Thus the clamp path P2 can be shortened and the wiring impedance of the clamp path P2 can be reduced.

FIG. 4 is a diagram illustrating an example of a component layout and a wiring pattern of the gate drive circuit 1000a. As is understood in comparison with the circuit diagram of FIG. 1, components of the gate drive circuit 1000a are placed on the board in an arrangement, which is different from the arrangement as illustrated in FIG. 1. The example of the layout illustrated in FIG. 4 presupposes the placement described above. In the gate drive circuit 1000a partitioned into the four quadrants with the current limit circuit 23 set as the origin, the gate terminal connector 21 and the source terminal connector 22 are placed in the first quadrant, the clamp switch 31 is placed in the second quadrant, and the charging/discharging switch circuit 28 is placed in the third quadrant. The charging/discharging switch circuit 28 includes the charging switch 29 and the discharging switch 30, which are formed into an IC, for instance. The negative bias capacitor 27 is placed in the second quadrant. Specifically, the negative bias capacitor 27 is placed between the clamp switch 31 and the charging/discharging switch circuit 28 and in vicinity of the clamp switch 31. In order to reduce the wiring impedance of the current paths, the pertinent wiring patterns are configured so as to be large in thickness and small in length.

In the example illustrated in FIG. 4, the current path through which electric discharge is carried out from the gate terminal connector 21 through the current limit circuit 23 toward the charging/discharging switch circuit 28 is configured with a thick wiring pattern. In the wiring pattern, a discharge current intensively flows in an area A0 in vicinity of the current path P4 that is the shortest route connecting the gate terminal connector 21 and the charging/discharging switch circuit 28. The instantaneous current that flows in from the parasitic capacitance of the power switch 10 flows through the area A0 in the wiring pattern. Therefore, an input terminal 31*t* of the clamp switch 31 is placed in the area A0. That is, the wiring line extending between the gate terminal connector 21 and the current limit circuit 23 passes through the second quadrant where the clamp switch 31 is placed. In other words, the shortest path between the gate terminal connector 21 and the current limit circuit 23 passes through the second quadrant.

In the gate drive circuit 1000*a*, as described above, the gate terminal connector 21 and the source terminal connector 22 are placed in the first quadrant, and the clamp switch 31 is placed in the second quadrant or the fourth quadrant. This configuration reduces in a balanced manner increase in turn-on time and turn-off time for the clamp switch 31 due to the heat generation on the circuit board 20*a* and increase in the turn-on time and the turn-off time for the clamp switch 31 due to the wiring impedance of the gate drive circuit.

In the gate drive circuit 1000*a*, the charging/discharging switch circuit 28, which includes the charging switch 29 and the discharging switch 30, may be placed in the third quadrant that is diagonally opposite to the first quadrant. Thus increase in turn-on time and turn-off time for the charging switch 29 and the discharging switch 30 due to the heat can be curbed.

In the gate drive circuit 1000*a*, the negative bias capacitor 27 may be placed in close vicinity of the clamp switch 31. One terminal of the negative bias capacitor 27 is connected to the low-side reference potential line that provides the negative bias potential and the other terminal of the negative bias capacitor 27 is connected to the source terminal connector 22. The negative bias capacitor 27 may be placed between the clamp switch 31 and the discharging switch 30. Thus the clamp path P2 can be shorter than the discharge path P1 extending through the discharging switch 30, and the wiring impedance of the clamp path P2 can be lower than the wiring impedance of the discharge path P1.

In the gate drive circuit 1000*a*, the shortest path, within wiring, between the gate terminal connector 21 and the current limit circuit 23 may pass through the second quadrant where the clamp switch 31 is placed. Thus the instantaneous current is less likely to flow toward the current limit circuit 23 and is more likely to flow toward the negative bias capacitor 27. Therefore, the increase in the gate-source voltage in the power switch 10 due to the instantaneous current and the voltage drop in the current limit circuit 23 can be curbed. That is, the instantaneous current is likely to flow through the clamp path P2, the increase in the gate-source voltage in the power switch 10 is thereby curbed and the erroneous firing of the power switch 10 is thereby prevented. The instantaneous current is likely to flow through the clamp path P2 because the component impedance and the wiring impedance on the clamp path P2 are small.

In the gate drive circuit 1000*a*, the synthetic impedance Z43 of the clamp path P2 may be lower than the synthetic impedance Z42 of the discharge path P1. Thus the instantaneous current is likely to flow through the clamp path P2, the increase in the gate-source voltage in the power switch 10 is thereby curbed, and the erroneous firing of the power switch 10 is thereby prevented.

In the gate drive circuit, the on-resistance of the clamp switch 31 may be smaller than the on-resistance of the discharging switch 30. Thus the increase in the gate-source voltage in the power switch 10 can be curbed and clamping effect by the clamp switch 31 can be increased.

In the gate drive circuit, the turn-on time for the clamp switch may be shorter than the turn-on time for the discharging switch 30. Thus the increase in the gate-source voltage in the power switch 10 can be curbed and the clamping effect by the clamp switch 31 can be increased.

Embodiment 2

Figure 5:
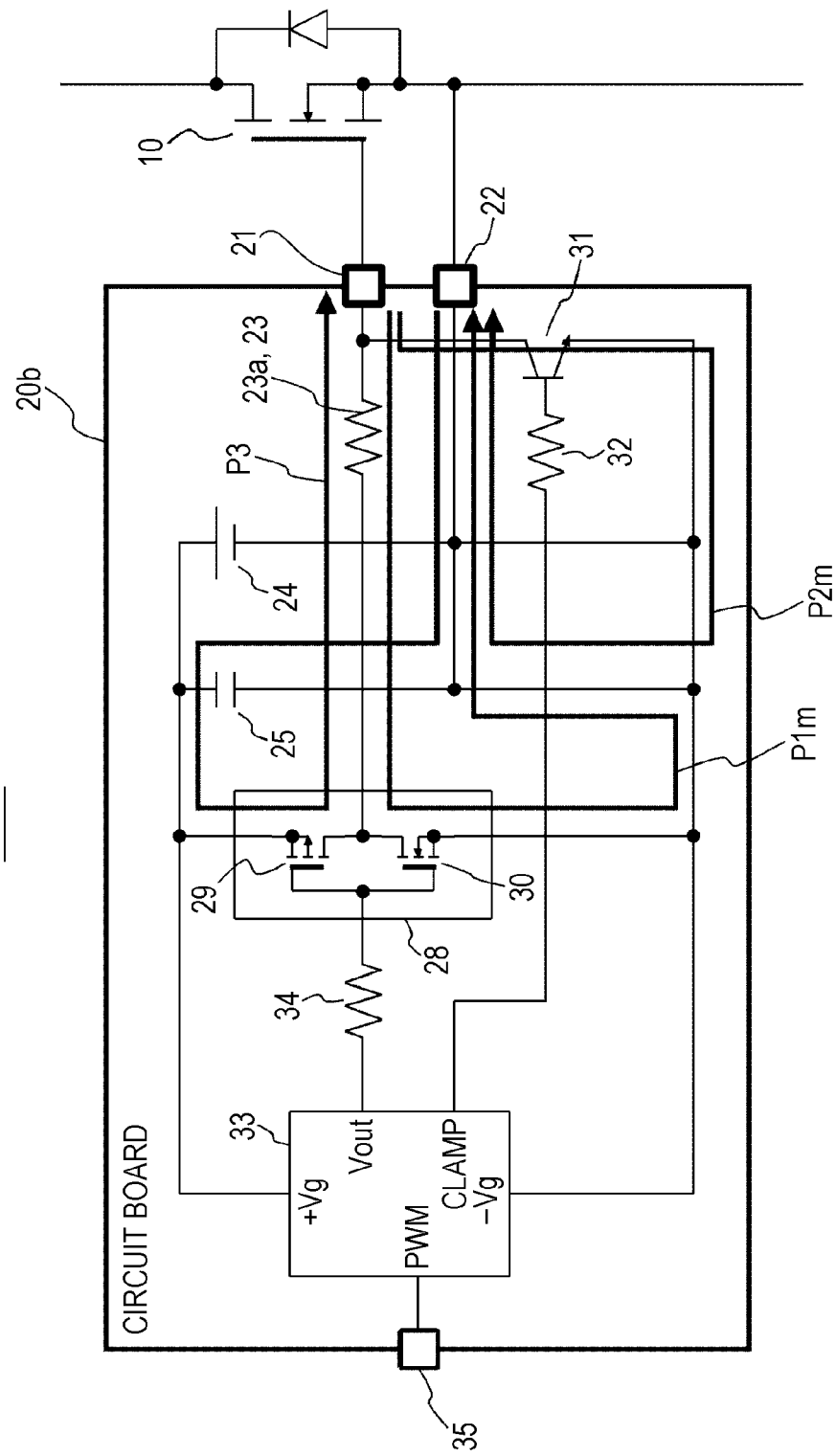
FIG. 5 is a diagram illustrating an example of a configuration of a gate drive circuit according to embodiment 2.

FIG. 5 is a diagram illustrating an example of a configuration of a gate drive circuit according to embodiment 2. The example of the configuration of the gate drive circuit 1000*b* which is illustrated in FIG. 5 includes the gate drive circuit 1000*a* which is illustrated in FIG. 1 and from which the negative bias power supply 26 and the negative bias capacitor 27 are removed. The gate drive circuit 1000*b* is capable of applying a positive bias voltage but incapable of applying a negative bias voltage between the gate and the source of the power switch 10, based on the potential at the source terminal of the power switch 10. For instance, on-voltage the gate drive circuit 1000*b* outputs is set at +Vg=20 V and off-voltage is set at 0 V.

The gate drive circuit 1000*b* does not include the negative bias capacitor 27. Therefore, synthetic impedance of a discharge path P1*m* in the gate drive circuit 1000*b* is smaller than the synthetic impedance of the discharge path P1 in the gate drive circuit 1000*a*, and synthetic impedance of a clamp path P2*m* in the gate drive circuit 1000*b* is smaller than the synthetic impedance of the clamp path P2. The discharge path P1*m* in the gate drive circuit 1000*b* is a current path that extends from the gate terminal connector 21, through a wiring line, the gate resistance 23*a*, a wiring line, the discharging switch 30, and a wiring line to the source terminal connector 22. Component impedance Zp2 of the discharge path P1*m* in the gate drive circuit 1000*b* can be defined as sum of the on-resistance of the discharging switch 30 and the gate resistance 23*a*. Wiring impedance Zl2*m* of the discharge path P1*m* in the gate drive circuit 1000*b* is a value obtained by subtraction, from the wiring impedance Zl2 of the discharge path P1 in the gate drive circuit 1000*a*, of a component thereof relating to the negative bias capacitor 27.

A clamp path P2*m* in the gate drive circuit 1000*b* is a current path that extends from the gate terminal connector 21, through a wiring line, the clamp switch 31, and a wiring line to the source terminal connector 22. Component impedance Zp3*m* of the clamp path P2*m* in the gate drive circuit 1000*b* can be defined as on-resistance of the clamp switch 31. Wiring impedance Zl3*m* of the clamp path P2*m* in the gate drive circuit 1000*b* is a value obtained by subtraction, from the wiring impedance Zl3 of the clamp path P2 in the gate drive circuit 1000*a*, of a component thereof relating to the negative bias capacitor 27. In the gate drive circuit 1000b also, the clamp path P2m and the discharge path P1m are designed so that the synthetic impedance Z43m of the clamp path P2m is smaller than the synthetic impedance Z42m of the discharge path P1m.

As described above, embodiment 2 provides effects similar to effects of embodiment 1. In addition, the synthetic impedance of the discharge path P1m and the synthetic impedance of the clamp path P2m in the gate drive circuit according to embodiment 2 are smaller than the synthetic impedance of the discharge path P1 and the synthetic impedance of the clamp path P2 in the gate drive circuit according to embodiment 1. Therefore, the increase in the gate-source voltage in the power switch 10 due to the instantaneous current and the wiring impedance for flow of the instantaneous current can further be reduced.

Embodiment 3

Figure 6:
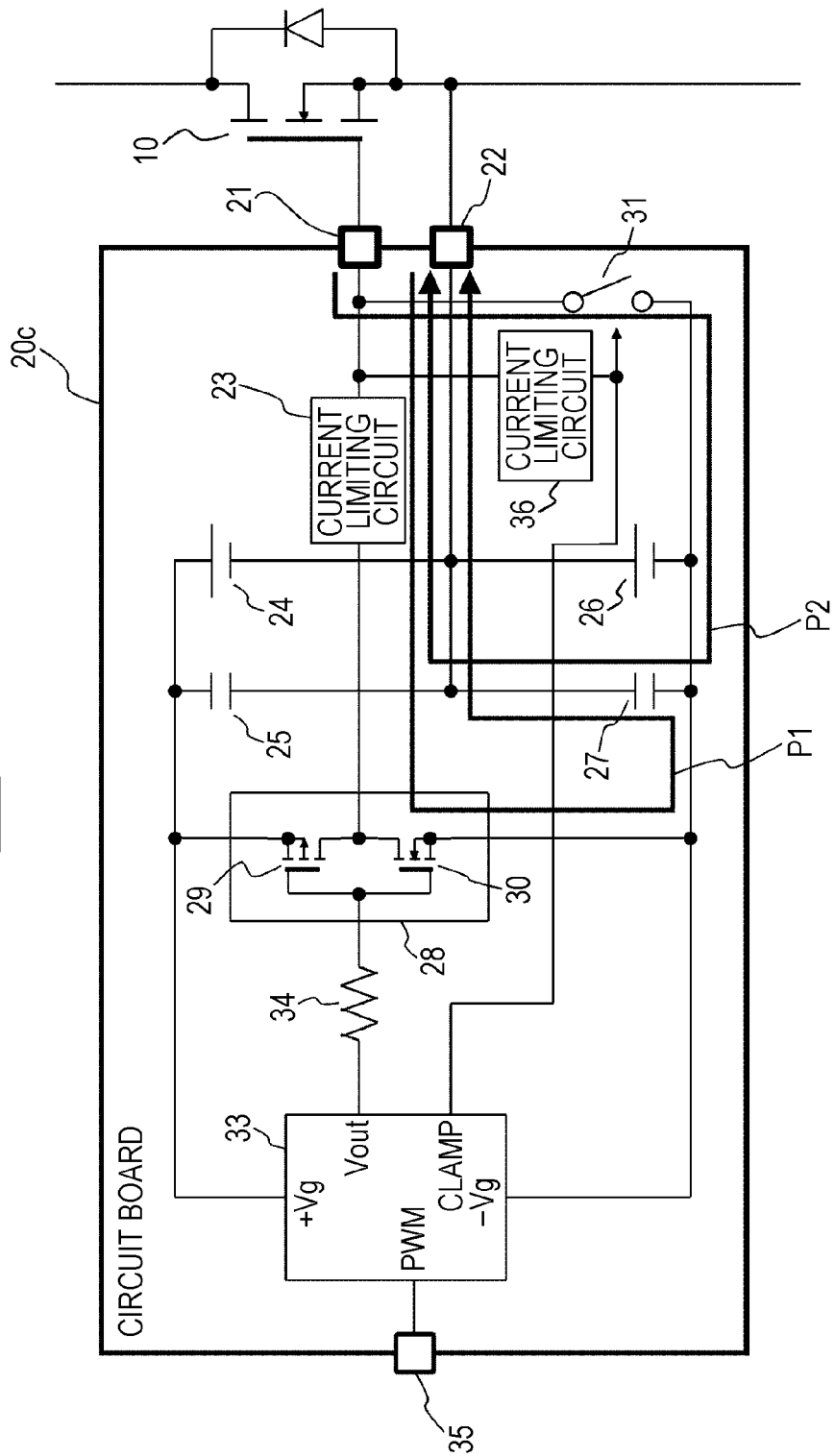
FIG. 6 is a diagram illustrating an example of a configuration of a gate drive circuit according to embodiment 3.

FIG. 6 is a diagram illustrating an example of a configuration of a gate drive circuit according to embodiment 3. The gate drive circuit 1000c illustrated in FIG. 6 has basically the same configuration as the gate drive circuit 1000a illustrated in FIG. 1 has, except that the clamp switch 31 is depicted as a switch symbol instead of a transistor symbol. In addition, the clamp resistor 32 is omitted in depiction.

The gate drive circuit 1000c illustrated in FIG. 6 includes a current limit circuit 36 between the wiring line extending between the gate terminal connector 21 and the current limit circuit 23 and the control terminal of the clamp switch 31. The current limit circuit 36 is a circuit for preventing malfunction of the clamp switch 31. The current limit circuit 36 may be a resistor, for instance, or may be other elements such as capacitor. In case where the instantaneous current is generated at the control terminal of the clamp switch 31 when the clamp switch 31 is in off state, the gate drive circuit 1000c is capable of discharging the instantaneous current through the current limit circuit 36. Accordingly, the clamp switch 31 can be prevented from erroneously tuning on.

In the gate drive circuit 1000c illustrated in FIG. 6, a pulsed high-frequency current flows through the charging switch 29 or the discharging switch 30, the current limit circuit 23, the gate terminal connector 21, and the source terminal connector 22, upon each switching of the power switch 10. The higher a speed at which the power switch 10 is to be driven, the greater a current peak value of the pulsed high-frequency current. A magnetic field by the current may be a factor that triggers off malfunction of the circuits.

As described above, the clamp switch 31 is placed so that the wiring impedance between the gate terminal connector 21 and the clamp switch 31 is lowered when viewed from the gate terminal connector 21 and the source terminal connector 22. Therefore, the clamp switch 31 is placed in vicinity of the path through which the high-frequency current described above flows. Then there is a possibility that the clamp switch 31 may malfunction under influence of the high-frequency current, depending on the placement of the clamp switch 31. That is, the clamp switch 31 may erroneously be turned on by the high-frequency current when the clamp switch 31 is to be in off-state in order to bring the power switch 10 into on-state. At this time, the power switch 10 is precipitously turned off shortly after being turned on. Thus the malfunction of the clamp switch 31 may be a factor that causes unstable operation of the power switch 10.

Figure 7:
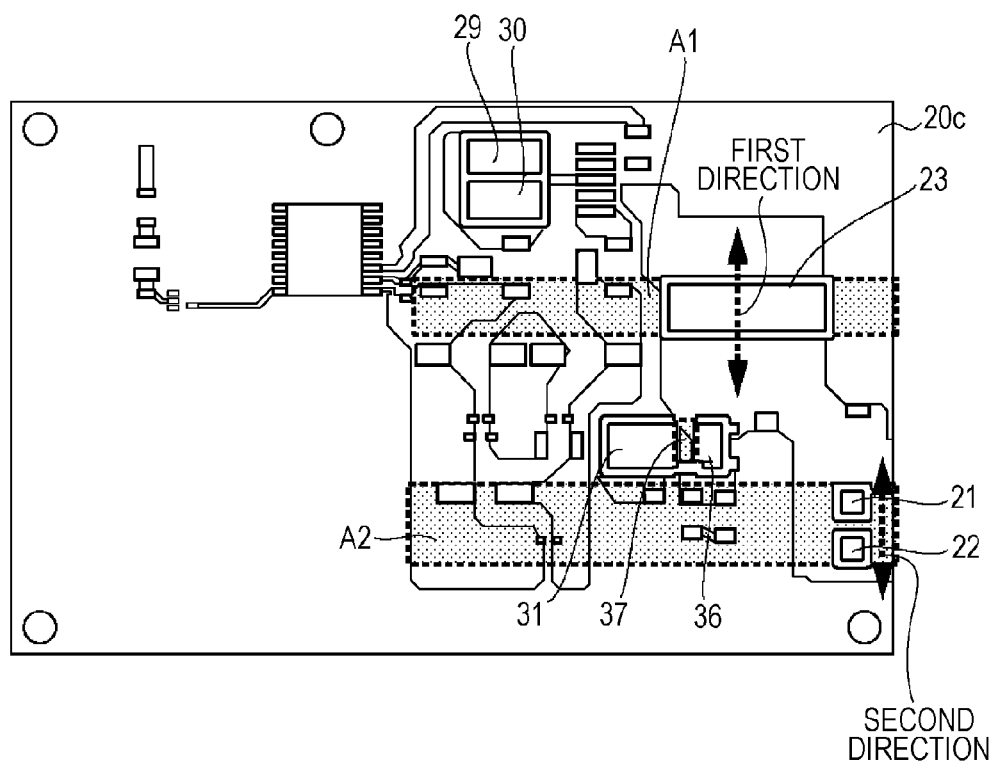
FIG. 7 is a diagram illustrating an example of a component layout and a wiring pattern of the gate drive circuit according to embodiment 3.

FIG. 7 is a diagram illustrating an example of a component layout and a wiring pattern of the gate drive circuit 1000c according to embodiment 3. In FIG. 7, a wiring path between the control terminal of the clamp switch 31 and the current limit circuit 36 is illustrated as a wiring path 37. The wiring path 37 is a path that extends from the control terminal of the clamp switch 31 through the current limit circuit 36 to the output terminal of the control terminal of the clamp switch 31.

Herein, a direction of a current that flows between both ends of the current limit circuit 23 is defined as a first direction. An area obtained from extension of an area where the current limit circuit 23 is placed in both directions orthogonal to the first direction is defined as a first area A1. Between both the ends of the current limit circuit 23, a charging current to the power switch 10 or a discharging current from the power switch 10 flows.

A direction of a straight line, a virtual line, passing through the gate terminal connector 21 and the source terminal connector 22 is defined as a second direction. An area obtained from extension of an area formed of the gate terminal connector 21, the source terminal connector 22, and an area between the gate terminal connector 21 and the source terminal connector 22 in both directions orthogonal to the second direction is defined as a second area A2.

In the gate drive circuit 1000c, the wiring path 37 is placed out of the first area A1 and the second area A2. Magnetic field is generated so as to be intense in a direction orthogonal to a direction in which a current flows. For instance, when the high-frequency current flows in high-speed switching of the power switch 10, a magnetic field is generated in a direction orthogonal to a direction of the current. That is, the first area A1 and the second area A2 are areas that are strongly influenced by the magnetic fields.

Sites in which currents flow are likely to be more concentrated in the current limit circuit 23, the gate terminal connector 21, and the source terminal connector 22 than in wiring lines formed of solid patterns, for instance. Accordingly, the magnetic fields are likely to be intense in vicinity of the current limit circuit 23, the gate terminal connector 21, and the source terminal connector 22. Therefore, the wiring path 37 is placed out of the first area A1 and the second area A2, and thereby the clamp switch 31 is less likely to be influenced by the magnetic fields. Thus the malfunction of the clamp switch 31 can be curbed and stable high-speed drive for the power switch 10 can be attained.

Figure 8:
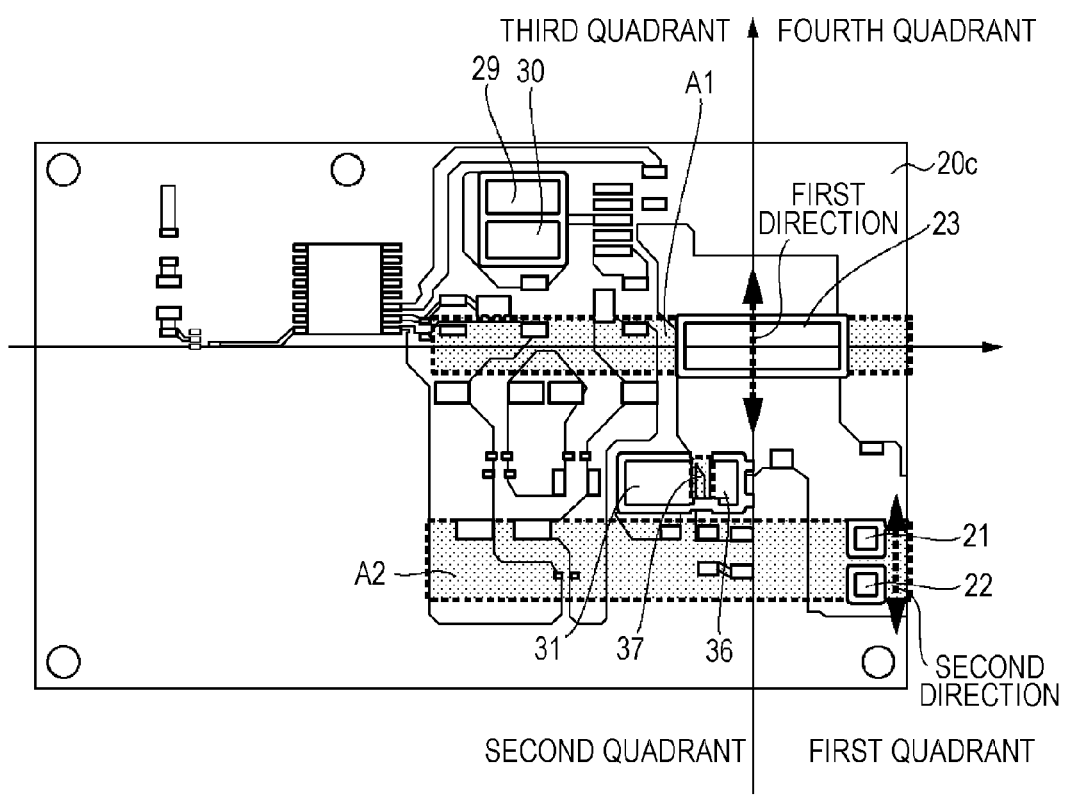
FIG. 8 is a diagram illustrating the gate drive circuit of FIG. 7 on which area partition lines illustrated in FIG. 3 are superimposed.

FIG. 8 is a diagram illustrating the gate drive circuit 1000c of FIG. 7 on which area partition lines illustrated in FIG. 3 are superimposed. In the gate drive circuit 1000c as well, placement of the current limit circuit 23, the gate terminal connector 21, the source terminal connector 22, the clamp switch 31, the charging switch 29, and the discharging switch 30 satisfies relations described for embodiment 1.

The clamp switch 31 is placed at a position that is nearer to the gate terminal connector 21 than the charging switch 29 and the discharging switch 30 are. Thus the wiring impedance between the gate terminal connector 21 and the clamp switch 31 that is viewed from the gate terminal connector 21 can be lower than wiring impedance of the charging switch 29 and the discharging switch 30 that is viewed from the gate terminal connector 21.

The gate terminal connector 21 and the source terminal connector 22 are placed in the first quadrant, the clamp switch 31 is placed in the second quadrant, and the charging switch 29 and the discharging switch 30 are placed in the third quadrant. Thus the influence the heat generation on the circuit board 20 and the wiring impedance exert upon the clamp switch 31 can be reduced in a balanced manner.

In embodiment 3, as described above, the malfunction of the clamp switch 31 due to the influence of the magnetic fields can be curbed by the placement of the wiring path 37 out of the first area A1 and the second area A2. In addition, the effects according to embodiments 1 and 2 are attained. That is, the gate drive circuit according to embodiment 3 reduces the influence of the heat generation, the wiring impedance, and the magnetic fields.

Embodiment 4

Figure 9:
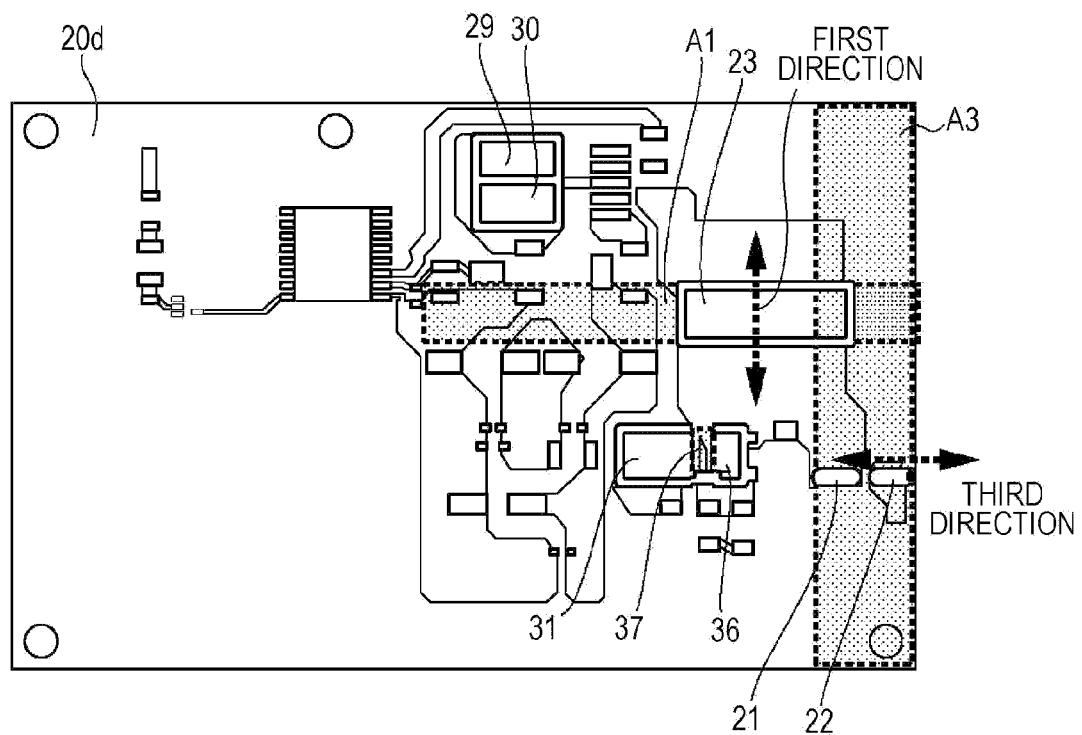
FIG. 9 is a diagram illustrating an example of a component layout and a wiring pattern of a gate drive circuit according to embodiment 4.

FIG. 9 is a diagram illustrating an example of a component layout and a wiring pattern of a gate drive circuit according to embodiment 4. Circuit configuration of the gate drive circuit 1000*d* illustrated in FIG. 9 is the same as circuit configuration of the gate drive circuit 1000*c*. A difference from embodiment 3 is placement of the gate terminal connector 21 and the source terminal connector 22. In the gate drive circuit 1000*c*, the gate terminal connector 21 and the source terminal connector 22 are placed so as to be arranged in short direction of the circuit board 20. In the gate drive circuit 1000*d*, by contrast, the gate terminal connector 21 and the source terminal connector 22 are placed so as to be arranged in longitudinal direction of the circuit board 20.

A direction of a straight line passing through the gate terminal connector 21 and the source terminal connector 22 is defined as a third direction. An area obtained from extension of an area formed of the gate terminal connector 21, the source terminal connector 22, and an area between the gate terminal connector 21 and the source terminal connector 22 in both directions orthogonal to the third direction is defined as a third area A3. In the example illustrated in FIG. 9, a current flows in the third direction when the power switch 10 is charged or discharged. A magnetic field generated by the current has great strength in a direction orthogonal to the third direction. In the gate drive circuit 1000*d*, therefore, the wiring path 37 is placed at a position clear of the third area A3.

In a configuration in which the first area A1 and the third area A3 are orthogonal as in the gate drive circuit 1000*d* as well, the wiring path 37 is placed at a position out of the first area A1 and the third area A3 for the same reason as that in the gate drive circuit 1000*c*. Thus the gate drive circuit 1000*d* also provides effects similar to the effects of the gate drive circuit 1000*c*.

Embodiment 5

Figure 10:
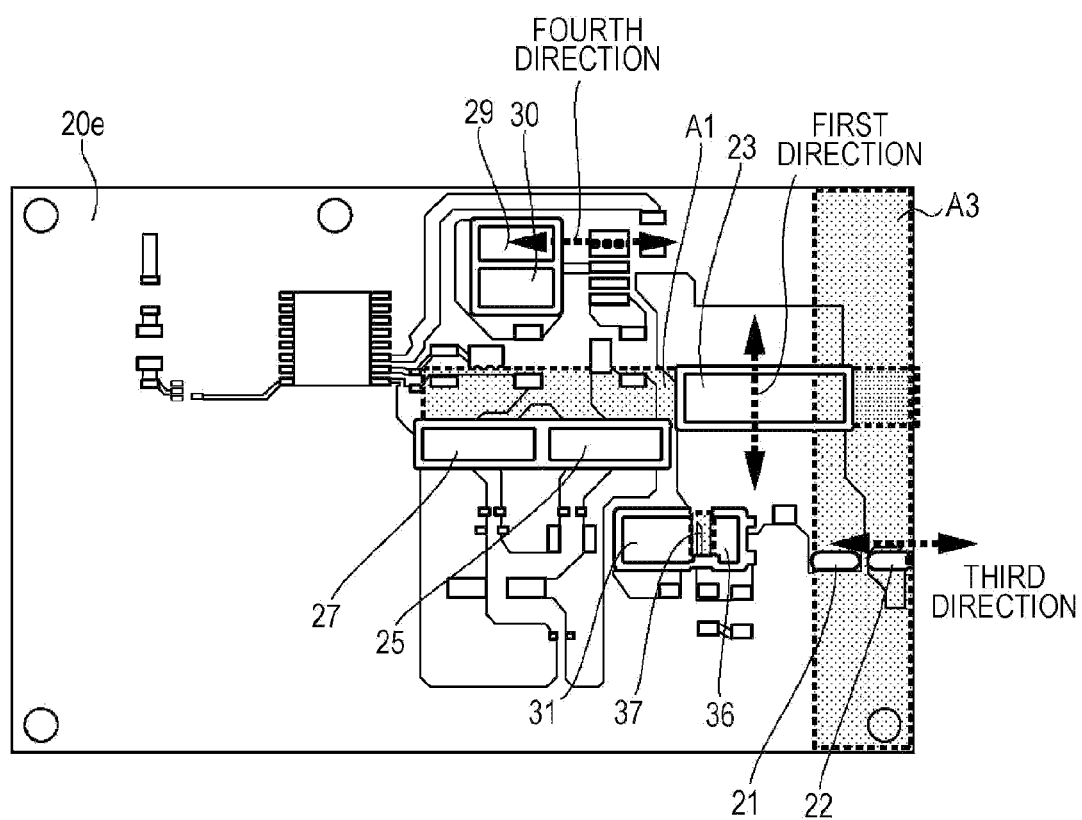
FIG. 10 is a diagram illustrating an example of a component layout and a wiring pattern of a gate drive circuit according to embodiment 5.

FIG. 10 is a diagram illustrating an example of a component layout and a wiring pattern of a gate drive circuit according to embodiment 5. The gate drive circuit 1000*e* illustrated in FIG. 10 includes metal members placed between the discharging switch 30 and the clamp switch 31. More specifically, the metal members are placed between the discharging switch 30, the charging switch 29 and the wiring path 37 between the clamp switch 31 and the current limit circuit 36. In the example illustrated in FIG. 10, the metal members are portions of the positive bias capacitor 25 and the negative bias capacitor 27. The metal members may be other than capacitors and may be electromagnetic shields, for instance.

When the power switch 10 is charged or discharged, a charging/discharging current flows through wiring lines connected to the discharging switch 30 and the charging switch 29. Hereinbelow, the wiring lines will be referred to as charging/discharging wiring lines. Direction of the current that flows through the charging/discharging wiring lines is defined as a fourth direction. A magnetic field generated by the charging/discharging current has great strength in a direction orthogonal to the fourth direction. The gate drive circuit 1000*e* includes the metal members between the charging/discharging wiring lines and the wiring path 37 between the clamp switch 31 and the current limit circuit 36. Thus the metal members are capable of reducing influence of the magnetic field that acts from the charging/discharging wiring lines toward the wiring path 37. Consequently, the malfunction of the clamp switch 31 can be curbed.

Embodiment 6

Figure 11:
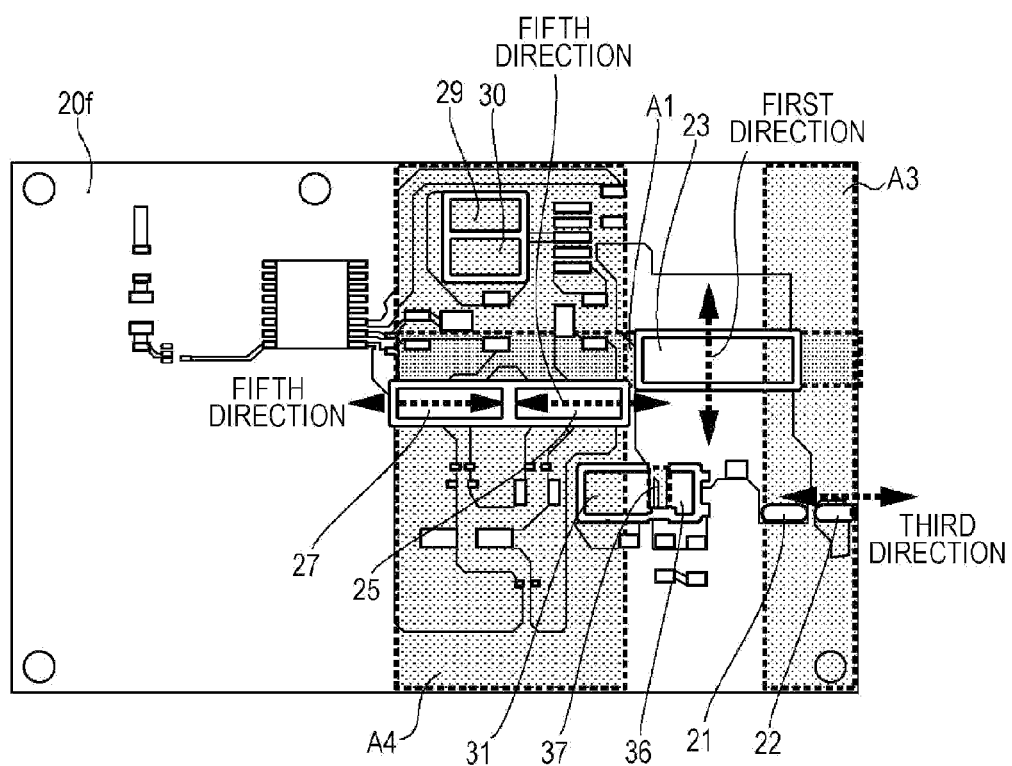
FIG. 11 is a diagram illustrating an example of a component layout and a wiring pattern of a gate drive circuit according to embodiment 6.

FIG. 11 is a diagram illustrating an example of a component layout and a wiring pattern of a gate drive circuit according to embodiment 6. In the gate drive circuit 1000*f* illustrated in FIG. 11, as in the gate drive circuit 1000*e* illustrated in FIG. 10, the positive bias capacitor 25 and the negative bias capacitor 27 that include the metal members are placed between the discharging switch 30, the charging switch 29 and the wiring path 37 between the clamp switch 31 and the current limit circuit 36.

In the example illustrated in FIG. 11, a direction of a straight line passing through a positive terminal and a negative terminal of the positive bias capacitor 25 is the same as a direction of a straight line passing through a positive terminal and a negative terminal of the negative bias capacitor 27. The direction is defined as a fifth direction. An area that is composed of an area obtained from extension of an area where the positive bias capacitor 25 is placed in both directions orthogonal to the fifth direction and an area obtained from extension of an area where the negative bias capacitor 27 is placed in both the directions orthogonal to the fifth direction is defined as a fourth area A4.

In the gate drive circuit 1000*f* that includes only either of the positive bias capacitor 25 or the negative bias capacitor 27, the fourth area A4 may be only either of the areas.

In the gate drive circuit 1000*f*, the wiring path 37 between the clamp switch 31 and the current limit circuit 36 is not only placed out of the first area A1 and the third area A3 but also placed out of the fourth area A4. In the example illustrated in FIG. 11, a current flows through the positive bias capacitor 25 and the negative bias capacitor 27 in the fifth direction when the power switch 10 is charged or discharged. A magnetic field generated by the current has great strength in a direction orthogonal to the fifth direction. Therefore, the wiring path 37 is placed at a position clear of the fourth area A4. Thus influence of the magnetic field that acts from the positive bias capacitor 25 and/or the negative bias capacitor 27 toward the wiring path 37 can be reduced. Consequently, the malfunction of the clamp switch 31 can be curbed.

Embodiment 7

Figure 12:
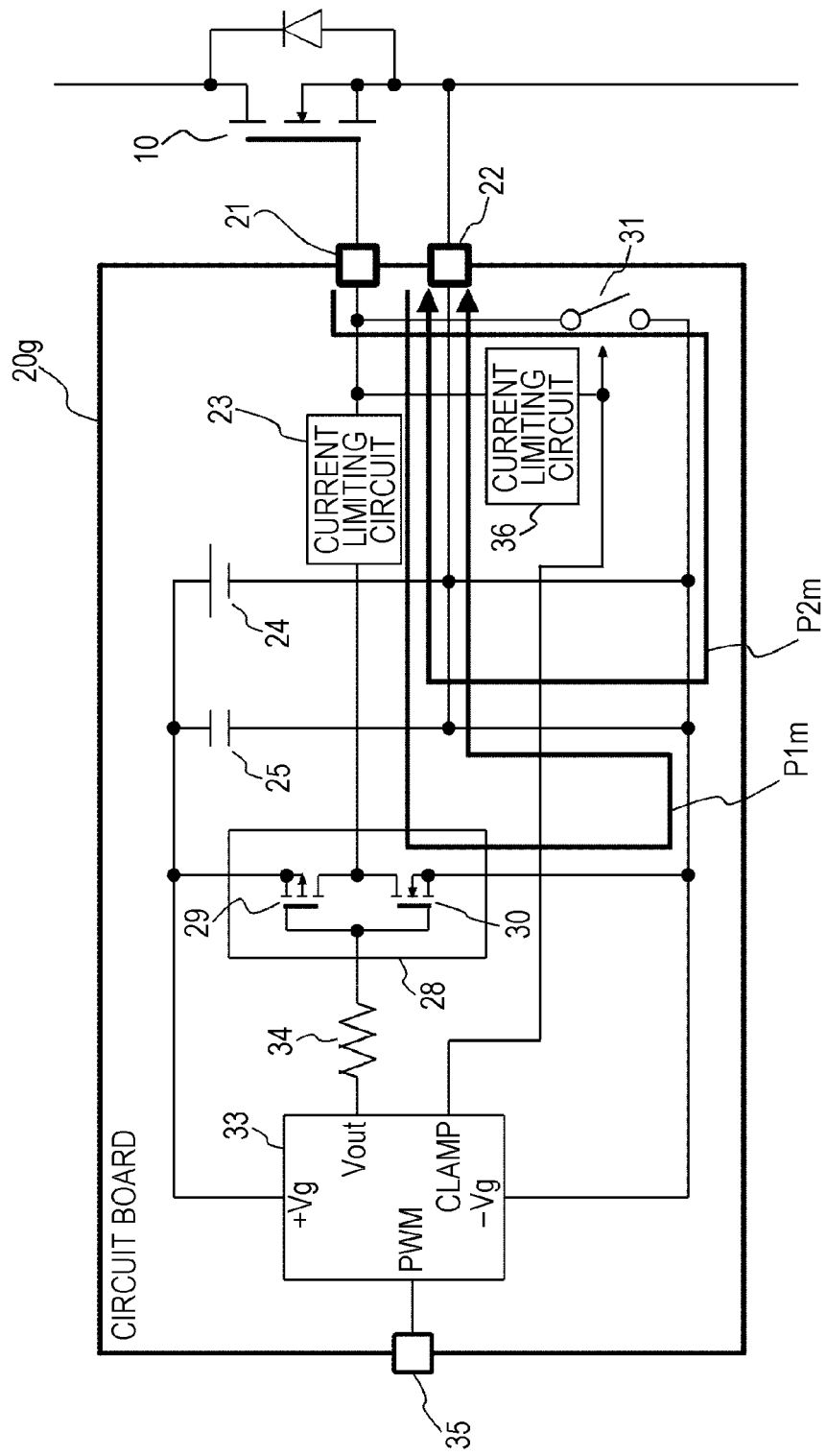
FIG. 12 is a diagram illustrating an example of a configuration of a gate drive circuit according to embodiment 7.

FIG. 12 is a diagram illustrating an example of a configuration of a gate drive circuit according to embodiment 7. The gate drive circuit 1000*g* which is illustrated in FIG. 12 is the gate drive circuit 1000*c* which is illustrated in FIG. 6 and from which the negative bias power supply 26 and the negative bias capacitor 27 are removed. The gate drive circuit 1000*g* is capable of applying a positive bias voltage but incapable of applying negative bias potential between the gate and the source of the power switch 10, based on the potential at the source terminal of the power switch 10. The gate drive circuit 1000*g* that performs switching operation using only the positive bias power supply provides effects similar to the effects of the gate drive circuits 1000*c*, 1000*d*, 1000e, and 1000f that perform the switching operation using the positive bias and negative bias power supplies.

Example of Application of Gate Drive Circuit

The power switch 10 that is to be driven by the gate drive circuits according to embodiments 1 through 6 may be used as a component of various power conversion circuits. Hereinbelow, a DC-DC converter and an inverter will be described as examples of the power conversion circuits. For instance, a DC-DC converter and an inverter that are installed on a vehicle may be assumed.

Figure 13:
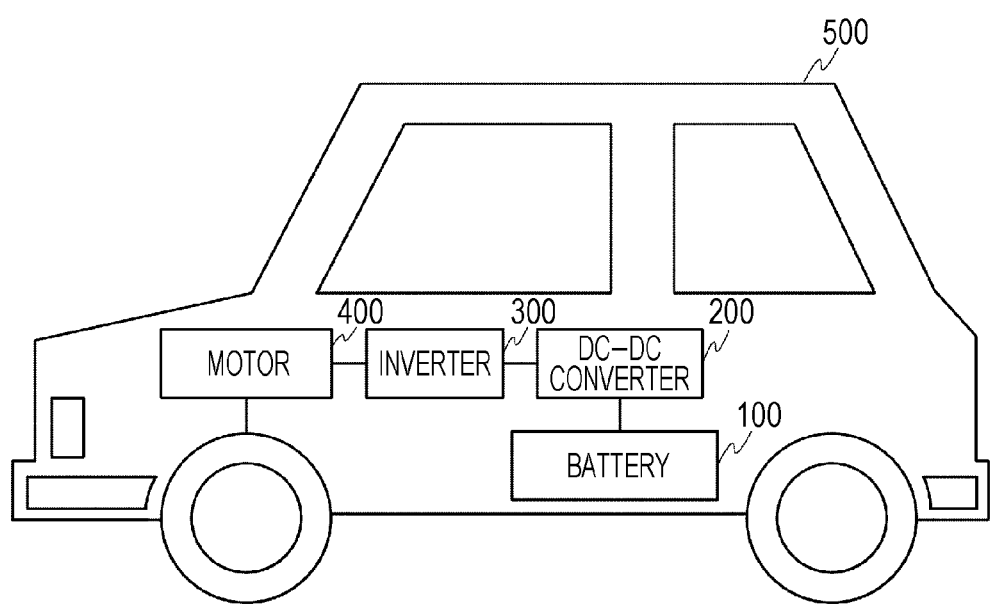
FIG. 13 is a diagram illustrating an example of a configuration of a vehicle to which the gate drive circuit according to embodiments 1 through 6 is applied as a drive device for a power conversion circuit.

FIG. 13 is a diagram illustrating an example of a configuration of a vehicle 500 that includes any of the gate drive circuits according to embodiments 1 through 6. Specifically, the vehicle 500 includes power conversion circuits and gate drive devices for driving the power conversion circuits. The gate drive devices each include the gate drive circuit. The power conversion circuits are the inverter and/or the DC-DC converter, for instance. The vehicle 500 illustrated in FIG. 13 is a hybrid vehicle (HV), a plug-in hybrid vehicle (PHV), or an electric vehicle (EV) on which a driving motor is installed, for instance. The motor is not limited to a motor that enables self-propelling and may be a driving assist motor that is installed on a mild hybrid vehicle, for instance. The vehicle 500 typically includes an alternating-current synchronous motor 400 as the motor 400.

The vehicle 500 illustrated in FIG. 13 includes a battery 100, the DC-DC converter 200, the inverter 300, and the motor 400. The battery 100 is a storage battery such as a lithium-ion battery and a nickel-hydrogen battery, for instance. The DC-DC converter 200 performs DC-DC conversion of direct-current power the battery 100 outputs and supplies the converted direct-current power to the inverter 300. The DC-DC converter 200 boosts a direct-current voltage the battery 100 outputs, for instance. The inverter 300 converts the direct-current power outputted from the DC-DC converter 200 into alternating-current power and supplies the alternating-current power to the motor 400. The inverter 300 is an N-phase (N is a natural number) inverter, for instance. Typically, the inverter 300 that is used for automotive application is a three-phase inverter. The three-phase inverter converts the inputted direct-current power into three-phase alternating-current power. The motor 400 is driven by the alternating-current power supplied from the inverter 300.

In the vehicle 500 in which energy regeneration function in deceleration is installed, the DC-DC converter 200 and the inverter 300 may be bidirectional. During energy regeneration, the inverter 300 converts alternating-current power generated by the motor 400 into direct-current power and supplies the direct-current power to the DC-DC converter 200. The DC-DC converter 200 steps down the direct-current power supplied from the inverter 300 and charges the battery 100 with the direct-current power.

Embodiment 8

Figure 14:
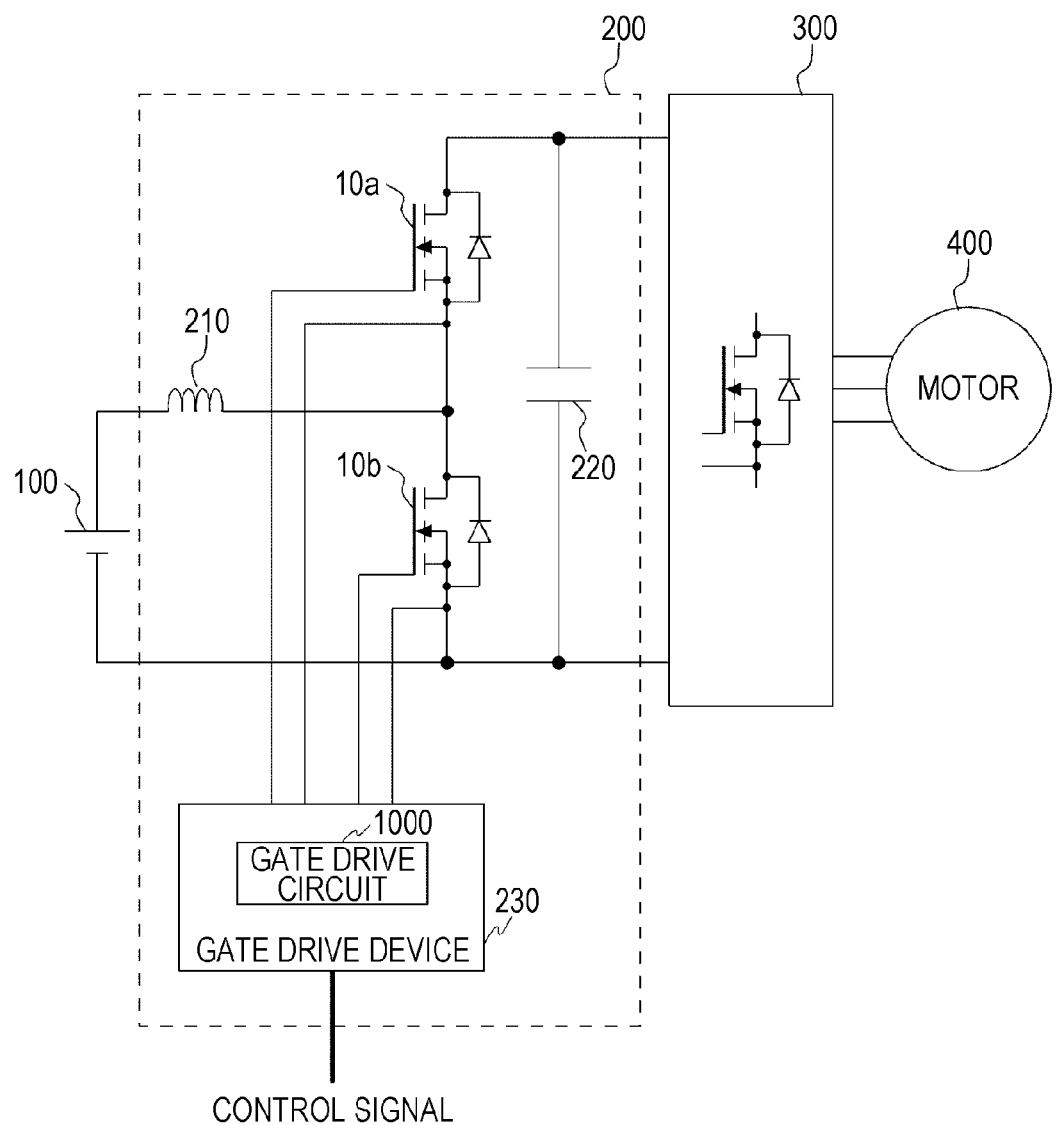
FIG. 14 is a diagram illustrating an example of a configuration of a circuit in a motor driving system according to embodiment 8.

FIG. 14 is a diagram illustrating an example of a configuration of a motor driving system according to embodiment 8. The motor driving system 550a illustrated in FIG. 14 is a motor driving system that is installed on the vehicle 500 illustrated in FIG. 13, for instance. The motor driving system 550a includes the DC-DC converter 200, the inverter 300, and the motor 400. In the example illustrated in FIG. 14, the DC-DC converter 200 includes the gate drive device 230 and the gate drive device 230 includes the gate drive circuits 1000.

The DC-DC converter 200 includes an inductor 210, a high-side power switch 10a, a low-side power switch 10b, a capacitor 220, and the gate drive device 230. The high-side power switch 10a and the low-side power switch 10b are MOSFETs or IGBTs. A freewheeling diode is connected to each of the high-side power switch 10a and the low-side power switch 10b in parallel and in opposite direction. The motor driving system 550a may include a smoothing capacitor (not illustrated) between the battery 100 and the DC-DC converter 200.

Operations during boosting will be described. The gate drive device 230 performs on/off control over the low-side power switch 10b. Magnetic energy is accumulated in the inductor 210 through agency of a current that flows from the battery 100. The capacitor 220 is electrically charged by the current from the battery 100 and a current from the inductor 210 in which the magnetic energy has been accumulated. Thus a voltage that has been boosted so as to be higher than the voltage of the battery 100 is outputted to the inverter 300. The boosted voltage is converted into alternating-current voltage by the inverter 300. The alternating-current voltage outputted from the inverter 300 drives the motor 400. The magnetic energy accumulated in the inductor 210 is converted into electric energy, which transfers through the freewheeling diode, connected to the high-side power switch 10a in parallel and in the opposite direction, to the capacitor 220.

Operations during step-down will be described. The alternating-current power generated by the motor 400 is converted into the direct-current power by the inverter 300. The direct-current power is accumulated as magnetic energy in the inductor 210 by on/off control over the high-side power switch 10a by the gate drive device 230. The direct-current power stepped down by the inductor 210 is regenerated for the battery 100.

The gate drive device 230 includes the gate drive circuits 1000 according to embodiments 1 through 6. The gate drive circuit for the high-side power switch 10a and the gate drive circuit for the low-side power switch 10b may be placed on one circuit board or may be placed on separate circuit boards. The gate drive device 230 receives PWM control signals from a control circuit (not illustrated), for instance, and supplies drive voltages to gate terminals of the high-side power switch 10a and the low-side power switch 10b. In the gate drive device 230 for automotive application, the control circuit receives control signals from a higher-level electronic control unit (ECU) through a controller area network (CAN).

As described above, the motor driving system 550a includes the gate drive device 230 upon which the influence of the heat generation, the wiring impedance, and the magnetic fields is reduced and is thus capable of stably driving the DC-DC converter 200. The gate drive device 230 is effective for the DC-DC converter 200 for automotive application for which high quality is demanded in particular.

Embodiment 9

Figure 15:
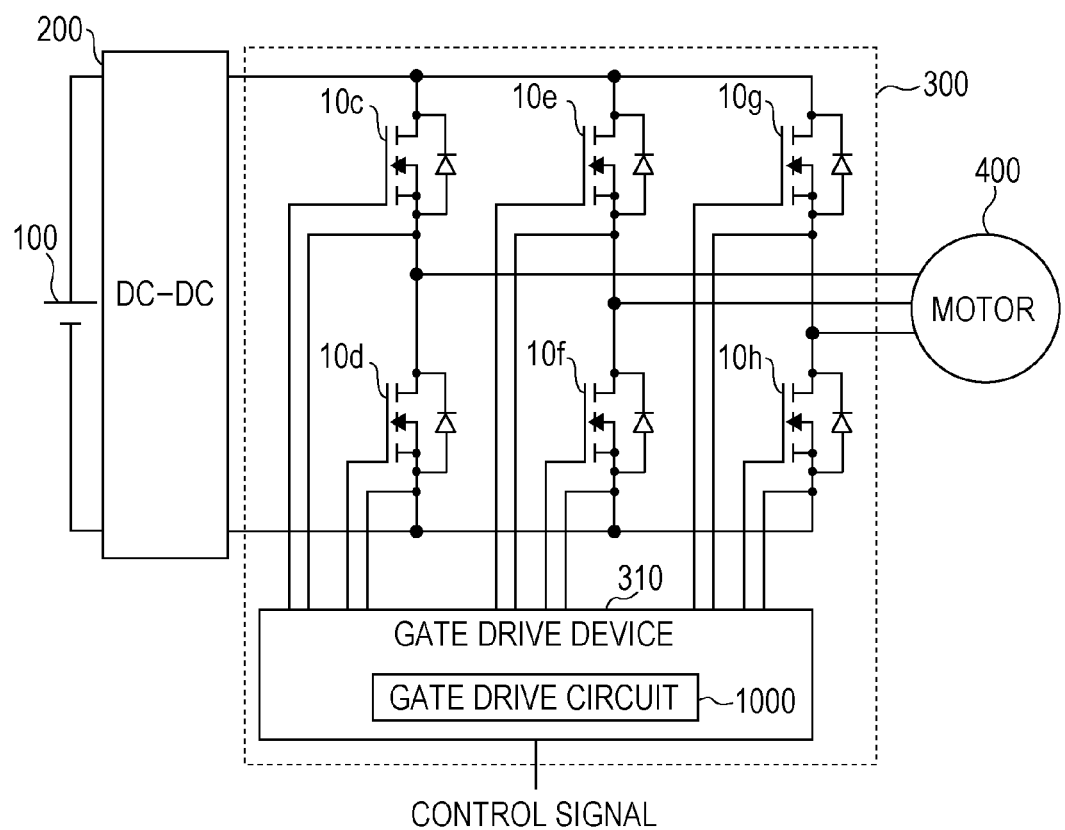
FIG. 15 is a diagram illustrating an example of a configuration of a circuit in a motor driving system according to embodiment 9.

FIG. 15 is a diagram illustrating an example of a configuration of a motor driving system 550b according to embodiment 9. The motor driving system 550b illustrated in FIG. 15 is a motor driving system that is installed on the vehicle 500 illustrated in FIG. 13, for instance. The motor driving system 550b includes the DC-DC converter 200, the inverter 300, and the motor 400. In the example illustrated in FIG. 15, the inverter 300 includes a gate drive device 310 and the gate drive device 310 includes the gate drive circuits 1000.

The inverter 300 is an N-phase (N is a natural number) inverter which includes legs that number in N and that are connected in parallel and in which each leg is composed of a high-side power switch and a low-side power switch. FIG. 15 illustrates an example of a three-phase inverter having three legs connected in parallel. The inverter 300 illustrated in FIG. 15 includes a U-phase high-side power switch 10c, a U-phase low-side power switch 10d, a V-phase high-side power switch 10e, a V-phase low-side power switch 10f, a W-phase high-side power switch 10g, a W-phase low-side power switch 10h, and the gate drive device 310. The six power switches 10c through 10h are connected by three-phase bridge. The bridge-connected six power switches 10c through 10h are MOSFETs or IGBTs, for instance. A freewheeling diode is connected to each of the power switches 10c through 10h in parallel and in opposite direction.

The six power switches 10c through 10h connected by the three-phase bridge perform switching for the direct-current power provided by the DC-DC converter 200 in accordance with drive signals supplied from the gate drive device 310. Thus alternating-current power with variable voltage and variable frequency is generated and supplied to the motor 400. The motor driving system 550b may include a smoothing capacitor (not illustrated) between the DC-DC converter 200 and the inverter 300.

The gate drive device 310 includes the gate drive circuits 1000 according to embodiments 1 through 6. For the gate drive circuits that control the bridge-connected six power switches 10c through 10h, all the gate drive circuits may be formed on one circuit board, the gate drive circuits corresponding to each leg may be placed on one circuit board, the gate drive circuits may be formed on two circuit boards for high side and low side, or the gate drive circuits may be formed on different circuit boards that respectively correspond to the power switches.

The gate drive device 310 receives PWM control signals, for generating alternating-current power with a predetermined voltage and a predetermined frequency, from a control circuit not illustrated and supplies drive voltages to gate terminals of the six power switch 10c through 10h connected by the three-phase bridge. In the gate drive device 310 for automotive application, the control circuit receives control signals from a higher-level ECU through a CAN.

As described above, the motor driving system 550b includes the gate drive device 310 upon which the influence of the heat generation, the wiring impedance, and the magnetic fields is reduced and is thus capable of stably driving the inverter 300. The gate drive device 310 is effective for the inverter 300 for automotive application for which high quality is demanded in particular.

Embodiment 8 and embodiment 9 that have been described above may be used in combination. That is, the drive devices for the DC-DC converter 200 and the inverter 300 of the motor driving systems 550a and 550b for automotive application may each include the gate drive device including the gate drive circuits according to embodiments 1 through 6. The DC-DC converter 200 may be omitted provided that the voltage of the battery 100 is as high as the voltage of the inverter 300.

The disclosure has been described above with the embodiments used as the examples. Various modifications to the embodiments may be attained by combination of the components and/or processing processes. It is to be understood by those skilled in the art that such modifications are encompassed by the scope of the disclosure.

FIG. 16 is a diagram illustrating modification 1 of partition of the gate drive circuit into areas. In the examples illustrated in FIGS. 3, 4, and 8, the gate drive circuits are each partitioned into the four quadrants by a straight line that passes through the current limit circuit 23 and that is parallel to longitudinal sides of the circuit board 20 and a straight line that passes through the current limit circuit 23 and that is parallel to lateral sides of the circuit board 20. A manner of the partition, however, is an example. The two partition lines have only to extend through the current limit circuit 23 and have only to be orthogonal to each other. For instance, the gate drive circuit may be partitioned into four quadrants by two partition lines that are slanted with respect to the longitudinal sides and the lateral sides of the circuit board 20. Angles of the two partition lines orthogonal to each other with the longitudinal sides and the lateral sides of the circuit board 20 can be set arbitrarily.

FIG. 17 is a diagram illustrating modification 2 of partition of the gate drive circuit into areas. In the examples illustrated in FIGS. 3, 4, and 8, the gate drive circuits are each partitioned into the four quadrants with center of the area where the current limit circuit 23 is placed set as the origin. Setting of the origin at the center of the area where the current limit circuit 23 is placed, however, is an example. The origin of the partition lines may be set at any desired position within the area where the current limit circuit 23 is placed. FIG. 17 illustrates the example in which the origin is set in vicinity of left side of the area where the current limit circuit 23 is placed.

Other Embodiments

The disclosure encompasses circuits that are capable of attaining functions characteristic of the disclosure, as well as the circuit configurations described above. For instance, the disclosure encompasses elements which are within such a scope as is capable of attaining the functions similar to the functions of the circuit configurations described above and to which elements such as switches (e.g., transistors), resistor elements, and capacitor elements are connected in series or in parallel. In other words, term "connected" used in the disclosure is not limited to direct connection between two terminals and connotes connection between the two terminals through elements within such a scope as allows the similar functions to be attained. In the disclosure, the first potential line has only to be a current path having the first potential and may be other than a wiring line. Similarly, the second potential line has only to be a current path having the second potential and may be other than a wiring line. For instance, the current path other than a wiring line may be a current path formed by connection between terminals of circuit elements.

In the disclosure, terms "being located on a circuit board" are not limited to being laid on the circuit board and connote being integrated the circuit board such as a multilayer board, for instance.

The embodiments and modifications thereto for which variations conceivable by those skilled in the art are provided and forms constructed by combining components of different embodiments or modifications thereof are intended to be included within the scope of the disclosure, unless departing from the purport of the disclosure.

In the drive device, the control terminal connector to be connected to the control terminal of the switch to be driven, the current limit circuit provided on the current path extending to the control terminal connector, and the clamp switch connected between the wiring line extending between the control terminal connector and the current limit circuit and the reference potential line may be placed on a common circuit board, for instance, the first quadrant, the second quadrant, the third quadrant, and the fourth quadrant in clockwise order may be defined as the four quadrants with the current limit circuit on the circuit board set as the origin, the control terminal connector may be placed in the first quadrant, and the clamp switch may be placed in the second quadrant or the fourth quadrant.

For instance, the clamp switch may be placed in either of the second or fourth quadrant in which the reference potential line is provided.

In the drive device, the charging switch that charges the control terminal of the switch with electric charge through the current limit circuit and the control terminal connector from the high-side reference potential line and the discharging switch that discharges electric charge from the control terminal of the switch through the control terminal connector and the current limit circuit to the low-side reference potential line may further be placed on the circuit board and may be placed in the third quadrant, for instance.

In the drive device, the conduction terminal connector that is to be connected to the input terminal or the output terminal of the switch may further be placed on the circuit board and may be placed in the first quadrant, for instance.

In the drive device, the capacitor connected between the wiring line extending to the conduction terminal connector and the low-side reference potential line may further be placed on the circuit board and may be placed in vicinity of the clamp switch, for instance.

The wiring line extending between the control terminal connector and the current limit circuit may pass through the quadrant where the clamp switch is placed, for instance.

In the drive device, the control terminal connector to be connected to the control terminal of the switch to be driven, the conduction terminal connector to be connected to the input terminal or the output terminal of the switch, the first current limit circuit provided on the current path extending to the control terminal connector, the clamp switch connected between the wiring line extending between the control terminal connector and the first current limit circuit and the reference potential line, and the second current limit circuit connected between the wiring line extending between the control terminal connector and the first current limit circuit and the control terminal of the clamp switch may be placed on a common circuit board, for instance, and the wiring path formed of the clamp switch and the second current limit circuit may be placed out of the first area obtained from the extension of the area where the first current limit circuit is formed in both the directions orthogonal to the direction of the current that flows between both the ends of the first current limit circuit and out of the second area obtained from the extension of the area formed of the control terminal connector, the conduction terminal connector, and the area between the control terminal connector and the conduction terminal connector in both the directions orthogonal to the direction of the straight line passing through the control terminal connector and the conduction terminal connector.

In the drive device, the charging switch that charges the control terminal of the switch with electric charge through the first current limit circuit and the control terminal connector from the high-side reference potential line and the discharging switch that discharges electric charge from the control terminal of the switch through the control terminal connector and the first current limit circuit to the low-side reference potential line may further be placed on the circuit board, for instance, and the clamp switch may be placed at a position that is nearer to the control terminal connector than the charging switch and the discharging switch.

With the first quadrant, the second quadrant, the third quadrant, and the fourth quadrant in clockwise order defined as the four quadrants with the first current limit circuit on the circuit board set as the origin, for instance, the control terminal connector and the conduction terminal connector may be placed in the first quadrant, the charging switch and the discharging switch may be placed in the third quadrant, and the clamp switch may be placed in the second quadrant or the fourth quadrant.

The metal members may further be placed on the circuit board and may be placed between the clamp switch and the discharging switch, for instance.

The metal members may be portions of the capacitors connected between the wiring line extending to the conduction terminal connector and the reference potential lines and the wiring path formed of the clamp switch and the second current limit circuit may be placed out of the third area obtained from the extension of the areas where the capacitors are formed in both the directions orthogonal to the direction of the straight lines passing through the positive terminals and the negative terminals of the capacitors, for instance.

The power conversion apparatus may include at least one switch and may include the power conversion circuit that converts the inputted power and the drive device that drives the switch, for instance.

The vehicle may include the battery, the DC-DC converter that performs DC-DC conversion of the voltage of the battery, the inverter that converts the direct-current power from the DC-DC converter into the alternating-current power, and the motor that is driven by the alternating-current power from the inverter and at least one of the DC-DC converter and the inverter may include the power conversion apparatus, for instance.

The vehicle may include the battery, the inverter that converts the direct-current power from the battery into the alternating-current power, and the motor that is driven by the alternating-current power from the inverter and the inverter may include the power conversion apparatus, for instance.

The disclosure may be utilized for a drive device for a DC-DC converter or an inverter of a motor driving system that is installed on a vehicle, for instance.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. An electric device comprising:
   a circuit board;
   a first potential line that provides first potential, the first potential line being located on the circuit board;
   a second potential line that provides second potential lower than the first potential, the second potential line being located on the circuit board;
   a control terminal connector that is located on the circuit board;
   a switch circuit that selectively switches whether electric charge is to be output from the control terminal connector or is to be received at the control terminal connector, the switch circuit being connected between the first potential line and the second potential line on the circuit board;
a current limit circuit that is connected between the switch circuit and the control terminal connector on the circuit board; and
a clamp switch that is connected between a conductive path, which extends between the control terminal connector and the current limit circuit, and the second potential line on the circuit board, wherein:
the clamp switch is located in a second quadrant or a fourth quadrant of four quadrants on the circuit board, where the four quadrants are partitioned by two mutually orthogonal virtual lines with the current limit circuit set as an origin and the four quadrants consist of a first quadrant including an area where the control terminal connector is located, the second quadrant, a third quadrant, and the fourth quadrant, in clockwise order,
the clamp switch is turned off when electric charge is supplied from the first potential line to the control terminal connector and output from the control terminal connector; and
the clamp switch is turned on when electric charge is received at the control terminal connector and supplied to the second potential line.

2. The electric device according to claim 1, wherein the clamp switch and the second potential line are located in the same quadrant.

3. The electric device according to claim 1, wherein the switch circuit is located in the third quadrant.

4. The electric device according to claim 1,
wherein the switch circuit includes:
a charging switch that is connected between the first potential line and the control terminal connector; and
a discharging switch that is connected between the control terminal connector and the second potential line.

5. The electric device according to claim 1, further comprising:
a conduction terminal connector that is located on the circuit board and in the first quadrant.

6. The electric device according to claim 5, further comprising:
a capacitor that is connected between the conduction terminal connector and the second potential line on the circuit board,
wherein the capacitor and the clamp switch are located in the same quadrant.

7. The electric device according to claim 1, wherein the clamp switch and at least a portion of the conductive path are located in the same quadrant.

8. The electric device according to claim 1, wherein the control terminal connector is to be connected to a control terminal of a power switch.

9. The electric device according to claim 8, wherein:
the control terminal connector is to be connected to a control terminal of a power switch, and
the conduction terminal connector is to be connected to a first conduction terminal or a second conduction terminal of the power switch.

10. An electric device comprising:
a circuit board;
a first potential line that provides first potential, the first potential line being located on the circuit board;
a second potential line that provides second potential lower than the first potential, the second potential line being located on the circuit board;
a control terminal connector that is located on a first region of the circuit board;
a conduction terminal connector that is located on a second region of the circuit board;
a switch circuit that selectively switches whether electric charge is to be output from the control terminal connector or is to be received at the control terminal connector, the switch circuit being connected between the first potential line and the second potential line on the circuit board;
a first current limit circuit that is located on a third region of the circuit board and that is connected between the switch circuit and the control terminal connector;
a clamp switch that is connected between a conductive path, which extends between the control terminal connector and the first current limit circuit, and the second potential line on the circuit board;
a second current limit circuit that is connected between the conductive path and a clamp control terminal of the clamp switch on the circuit board; and
one or more wiring lines that extend between the clamp switch and the second current limit circuit,
wherein the clamp switch, the second current limit circuit, and the one or more wiring lines are located out of a first area and a second area, where the first area is an area obtained from extension of the third region in both directions orthogonal to a direction of a current that flows through the first current limit circuit, and the second area is an area obtained from extension of the first region, the second region, and a region therebetween in both directions orthogonal to a straight line passing through the first region and the second region.

11. The electric device according to claim 10,
wherein the one or more wiring lines include:
a first wiring line connecting between the clamp control terminal of the clamp switch and the second current limit circuit; and
a second wiring line connecting between a clamp conduction terminal of the clamp switch and the second current limit circuit.

12. The electric device according to claim 10, wherein:
the clamp switch is turned off when electric charge is supplied from the first potential line to the control terminal connector and output from the control terminal connector; and
the clamp switch is turned on when electric charge is received at the control terminal connector and supplied to the second potential line.

13. The electric device according to claim 10, wherein the clamp switch is located at a position that is nearer to the control terminal connector than the switch circuit.

14. The electric device according to claim 13, further comprising:
a capacitor that is located on a fourth region of the circuit board and that is connected between the conduction terminal connector and the second potential line, the capacitor including one or more metal member,
wherein the clamp switch, the second current limit circuit, and the one or more wiring lines are located further out of the third area, where an area obtained from extension of the fourth region in both directions orthogonal to a straight line passing through a pair of terminals of the capacitor.

15. The electric device according to claim 10,
wherein the switch circuit is located in a third quadrant, and the clamp switch is located in a second quadrant or a fourth quadrant of four quadrants on the circuit board, where the four quadrants are partitioned by two mutually orthogonal virtual lines with the first current limit circuit set as an origin and the four quadrants consist of a first quadrant being an area where the control terminal connector is located, the second quadrant, the third quadrant, and the fourth quadrant, in clockwise order.

16. The electric device according to claim 10, further comprising:
one or more metal members located on the circuit board, wherein the switch circuit includes:
a charging switch that is connected between the first potential line and the control terminal connector; and
a discharging switch that is connected between the second potential line and the control terminal connector, and
wherein the one or more metal members are located between the clamp switch and the discharging switch.

17. The electric device according to claim 10, wherein:
the control terminal connector is to be connected to a control terminal of a power switch, and
the conduction terminal connector is to be connected to a first conduction terminal or a second conduction terminal of the power switch.

18. An electric device comprising:
a circuit board;
a first potential line that provides first potential, the first potential line being located on the circuit board;
a second potential line that provides second potential lower than the first potential, the second potential line being located on the circuit board;
a control terminal connector that is located on the circuit board;
a switch circuit that selectively switches whether electric charge is to be output from the control terminal connector or is to be received at the control terminal connector, the switch circuit being connected between the first potential line and the second potential line on the circuit board;
a current limit circuit that is connected between the switch circuit and the control terminal connector on the circuit board; and
a clamp switch that is connected between a conductive path, which extends between the control terminal connector and the current limit circuit, and the second potential line on the circuit board, wherein:
the clamp switch is located in a second quadrant or a fourth quadrant of four quadrants on the circuit board, where the four quadrants are partitioned by two mutually orthogonal virtual lines with the current limit circuit set as an origin and the four quadrants consist of a first quadrant including an area where the control terminal connector is located, the second quadrant, a third quadrant, and the fourth quadrant, in clockwise order,
the electric device further comprises:
a conduction terminal connector that is located on the circuit board and in the first quadrant; and
a capacitor that is connected between the conduction terminal connector and the second potential line on the circuit board, and
the capacitor and the clamp switch are located in the same quadrant.

* * * * *